United States Patent [19]
Naomoto et al.

[11] Patent Number: 5,932,003
[45] Date of Patent: *Aug. 3, 1999

[54] METHOD OF PRODUCING RECRYSTALLIZED-MATERIAL-MEMBER, AND APPARATUS AND HEATING METHOD THEREFOR

[75] Inventors: Hideo Naomoto; Akihiro Takami; Takashi Ishihara, all of Tokyo; Takashi Ito, Kyoto; Takatoshi Chiba, Kyoto; Eiichi Tamaki, Kyoto, all of Japan

[73] Assignees: Mitsubishi Denki Kabushiki Kaisha, Tokyo; Dainippon Screen Mfg. Co., Ltd., Kyoto, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,918

[22] Filed: Jan. 13, 1997

[30] Foreign Application Priority Data

Mar. 4, 1996 [JP] Japan .................................. 8-046408

[51] Int. Cl.$^6$ .................................................. C30B 15/26
[52] U.S. Cl. .................................. 117/44; 117/3; 117/10; 117/37

[58] Field of Search .................................. 117/44, 54, 57, 117/61, 81, 82, 83, 3, 4, 10, 37

[56] References Cited

U.S. PATENT DOCUMENTS

| | | | |
|---|---|---|---|
| 4,578,143 | 3/1986 | Arai | 117/43 |
| 4,707,217 | 11/1987 | Aklufi | 117/43 |
| 4,737,233 | 4/1988 | Kamgar et al. | 117/43 |
| 4,784,723 | 11/1988 | Sakurai | 117/43 |
| 4,888,302 | 12/1989 | Ramesh | 117/44 |
| 5,228,948 | 7/1993 | Deguchi | 117/43 |

*Primary Examiner*—Felisa C. Garrett-Hiteshew
*Attorney, Agent, or Firm*—Oblon, Spivak, McClelland, Maier & Neustadt, P.C.

[57] ABSTRACT

The present invention relates to a method of producing a recrystallized-material-member by melting a given zone of a crystalline-material-member and moving the molten zone continuously along the crystalline-material-member to recrystallize a desired region of the crystalline-material-member, wherein dimension of the molten zone of the crystalline-material-member is controlled to be constant and/or quality of crystal of the recrystallized-material-member is controlled to be uniform.

16 Claims, 11 Drawing Sheets

METHOD OF PRODUCING RECRYSTALLIZED-MATERIAL-MEMBER, AND APPARATUS AND HEATING METHOD THEREFOR

BACKGROUND OF THE INVENTION

The present invention relates to a method of producing a member of recrystallized material (hereinafter referred to as "recrystallized-material-member") and an apparatus used therefor. The present invention also relates to a method of producing a thin film semiconductor which is a recrystallized-material-member used for LSI devices and solar cells, and an apparatus used therefor. Further, the present invention relates to a method of producing the above-mentioned thin film semiconductor having an SOI structure, and an apparatus used therefor.

Further, the present invention relates to a method of heating materials to be heat-treated.

As examples of the recrystallized-material-member obtained by recrystallizing a member of crystalline material (hereinafter referred to as "crystalline-material-member"), there can be exemplified a thin film semiconductor used for LSI devices, solar cells and the like. The thin film semiconductor is usually produced by melting and recrystallizing the crystalline-material-member under optional conditions to increase a size of crystal grains. In many cases, the thin film semiconductor is provided on a substrate and is covered or sandwiched with insulators.

FIG. 13 shows a partial sectional view of one embodiment of the above-mentioned thin film semiconductor. In FIG. 13, numeral 132 indicates a substrate, numeral 133 indicates a first insulator, numeral 134 indicates a thin film semiconductor, numeral 135 indicates a second insulator and numeral 131 shows a deposited layer comprising the substrate 132, the first insulator 133, the thin film semiconductor 134 and the second insulator 135.

Such a deposited layer is heated to recrystallize the thin film semiconductor, and thus the deposited layer having the thin film semiconductor layer is produced.

FIG. 14 shows an explanatory view of a conventional apparatus for recrystallizing a thin film semiconductor and a conventional method of recrystallization using that apparatus. In FIG. 14, numeral 141 indicates a deposited layer comprising a substrate, a first insulator, a thin film semiconductor and a second insulator (In FIG. 14, for the purpose of easy illustration, only the thin film semiconductor is depicted. The thin film semiconductor in the deposited layer 141 comprises the numerals 142, 143 and 144.), numeral 142 indicates a recrystallized zone of the thin film semiconductor, numeral 143 indicates a molten zone of the thin film semiconductor by heat-treating, numeral 144 indicates an unmolten zone of the thin film semiconductor, numeral 145 indicates a susceptor for supporting the deposited layer 141, numeral 146 indicates a melting heater for supplying thermal energy to the thin film semiconductor, numeral 147 indicates an elliptic mirror for focusing energy from the melting heater onto the desired region of the deposited layer 141, numeral 148 indicates an auxiliary line (short dashed line) illustrating a state of energy being focused onto the deposited layer 141 by the elliptic mirror 147, numeral 149 indicates a base heater for heating the whole of the thin film semiconductor to an optional temperature lower than the melting temperature of the thin film semiconductor, and numeral 150 indicates an arrow indicating a scanning direction of the melting heater 146 and the elliptic mirror 147. The deposited layer 141 and the susceptor 145 are provided inside a chamber (not shown in FIG. 14) for the purpose of atmosphere control, prevention of mixing of impurities and foreign matters and confinement of heat.

According to the above-mentioned conventional method, first, the deposited layer 141 supported by the susceptor 145 is heated by the base heater 149 to an optional temperature lower than the melting temperature of the thin film semiconductor. Then the given zone of the thin film semiconductor is melted by, for example, irradiating infrared rays, i.e. generating energy from the melting heater through heating by the melting heater 146, and focusing that energy with the elliptic mirror 147 onto the given zone of the deposited layer 141. Subsequently the melting heater 146 and the elliptic mirror 147 are moved in parallel with the direction of the arrow 150 at a given scanning speed, and thus the above-mentioned zone to be melted can be continuously moved along the thin film semiconductor, thereby continuously melting the given zone of the thin film semiconductor and then solidifying by turns to successively advance the recrystallization by using the formerly solidified zone as a seed for recrystallization. With this recrystallization, crystals having a grain size of several millimeters to several centimeters can be obtained, though it depends on the thickness of the thin film semiconductor and the scanning speed.

However, in case where the zone to be melted is wide, melting of the substrate or peeling off of the insulator tend to arise. Therefore it is necessary to narrow the zone to be melted of the deposited layer 141 where energy from the melting heater 146 is focused (for example, in case where energy is focused on a band-like zone as shown in FIG. 14, it is necessary to narrow the width of the band-like zone to several millimeters.). The thickness of the thin film semiconductor is usually as small as several micrometers to several tens of micrometers. Therefore, it is very difficult to maintain the temperature of the zone to be melted of the thin film semiconductor constant. Also, the above-mentioned zone of the deposited layer, where energy is focused, is required to be continuously moved along the deposited layer (along the thin film semiconductor). For that reason, it is very difficult to measure continuously the temperature of the zone to be melted of the thin film semiconductor.

According to the above-mentioned conventional method, energy outputs of the melting heater 146 and the base heater 149 were controlled by an open-loop control, that is, the thin film semiconductor was melted continuously by setting the energy outputs previously and continuing supply of energy according to the set outputs. However, in such a method, there were cases where (1) the temperature of the substrate 132 (shown in FIG. 13) became unstable, for example, due to wholly nonuniform contact between the susceptor and the thin film semiconductor (there were contacting portions and non-contacting portions) or due to instable atmosphere temperature (atmosphere temperature was not constant throughout the process); (2) variation of the energy outputs from the melting heater 146 and/or the base heater 149 arose during the scanning due to unstable power supply from power source or unstable control signal; (3) variation of a distance between the melting heater 146 and the thin film semiconductor 144 arose during the scanning due to mechanical inaccuracy of an apparatus or vibration of the apparatus itself or from outside the apparatus. In those cases, there was such a problem that the temperature of the zone to be melted of the thin film semiconductor does not become constant.

If such a problem arises, a density of crystal defects of the obtained thin film semiconductor, such as a dislocation cluster, twin, dislocation and sub-grain boundary increases, and thus crystal quality is apt to become nonuniform.

Also, when the temperature of the molten zone of the thin film semiconductor is too low, sufficient melting cannot be carried out, and when too high, for example, in the deposited layer 131 shown in FIG. 13, there is a case where the obtained thin film semiconductor 134 is peeled off from the insulator 133 or 135.

In the thin film semiconductor obtained by such a method as mentioned above, problems with appearance and crystallinity are apt to arise, and the proportion of the portion which can be used as a product is smaller, i.e. yield is reduced.

An object of the present invention is to provide the recrystallized-material-member having a uniform crystal quality by recrystallizing a crystalline-material-member.

SUMMARY OF THE INVENTION

The present invention relates to the method of producing a recrystallized-material-member by melting a given zone of a crystalline-material-member and moving the molten zone continuously along the crystalline-material-member to recrystallize a desired region of the crystalline-material-member, in which dimension of the molten zone of the crystalline-material-member is controlled to be constant and/or quality of crystal of the recrystallized-material-member is controlled to become uniform.

Also, the present invention relates to the method of producing a recrystallized-material-member by melting a given zone of a crystalline-material-member and moving the molten zone continuously along the crystalline-material-member to recrystallize a desired region of the crystalline-material-member, in which a temperature of the molten zone of the crystalline-material-member is controlled to be constant and/or quality of crystal of the recrystallized-material-member is controlled to become uniform by measuring the temperature of the molten zone or its adjacent zone of the crystalline-material-member with a non-contact type pyrometer which is sensitive to infrared rays having a wavelength of not less than 4 $\mu$m.

Further the present invention relates to the apparatus for producing the recrystallized-material-member by melting the given zone of the crystalline-material-member and moving the molten zone of the crystalline-material-member continuously along the crystalline-material-member to recrystallize a desired region thereof. The apparatus comprises a melting heater for supplying energy to the crystalline-material-member and melting the given zone thereof and a control means for making dimension of the molten zone constant and/or making crystal quality of the recrystallized-material-member uniform.

It is preferable that the above-mentioned control means comprises means for measuring dimension of the molten zone of the crystalline-material-member and means for regulating an amount of energy to be supplied from the melting heater to the crystalline-material-member so that the measured value converges on the preset value.

Also, it is preferable that the above-mentioned control means comprises means for measuring a temperature of the molten zone of the crystalline-material-member and means for regulating an amount of energy to be supplied from the melting heater to the crystalline-material-member so that the measured value converges on the preset value.

Also the present invention relates to the method of heating with an elliptic mirror and a heating source, in which the section of the elliptic mirror is an ellipse having a concave with a specific curvature and the concave is produced by extrapolating a circle with the curvature so that the center of the circle coincides with one of the focuses of the ellipse and that the heating source does not give interference to the elliptic mirror.

DETAILED DESCRIPTION OF THE INVENTION

Figure 1:
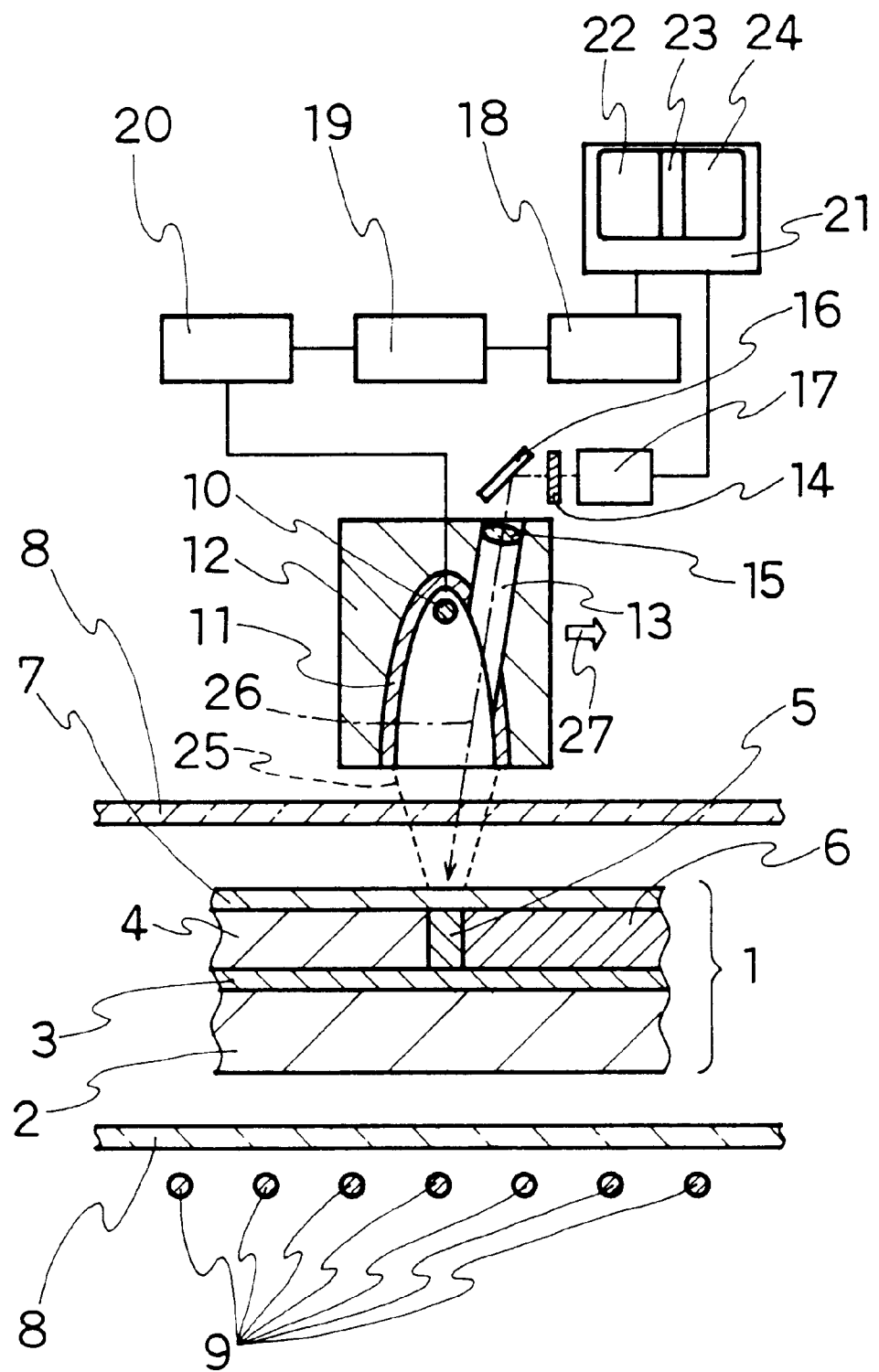
FIG. 1 is an explanatory view of Embodiment (A) of the method of producing the recrystallized-material-member of the present invention.

According to the method and apparatus for producing the recrystallized-material-member of the present invention, energy is supplied to the surface of the crystalline-material-member to melt the given zone thereof, the energy-supplied molten zone is continuously moved along the surface of the crystalline-material-member with regulating an amount of energy in compliance with a measured dimension or temperature of the molten zone of the crystalline-material-member, and thereby the desired region of the crystalline-material-member can be recrystallized and the recrystallized-material-member having uniform crystal quality can be obtained.

As the method or means for regulating an amount of energy to be supplied to the above-mentioned crystalline-material-member, there is a method or means to regulate an amount of energy by controlling power supply to an energy generating source, controlling a distance between the energy generating source and the above-mentioned crystalline-material-member or controlling a scanning speed (transfer speed) of the energy generating source.

The above-mentioned crystalline-material-member may have either of a material having crystals and amorphous material, and may be one which can be recrystallized (crystallized in case of an amorphous material. In the present invention, the word "recrystallization" covering crystallization of an amorphous material is used for simplification of description) through the method of the present invention and can become a recrystallized-material-member having crystals.

The thickness of the above-mentioned crystalline-material-member used in the present invention can be selected optionally, and, for example, when a thin film semiconductor is used as the crystalline-material-member, its thickness is generally from about 0.1 $\mu$m to about 60 $\mu$m.

The shape of the molten zone on the surface of the crystalline-material-member, which is melted by the above-mentioned energy (hereinafter may be referred to as "surface shape of molten zone") varies depending on the shape of the energy generating source (hereinafter may be referred to as "melting heater"), and is usually band-like or circular. When the surface shape of the molten zone is band-like or circular, it is easy to estimate the surface shape and the dimension of it. In addition to the band-like and circular shapes, various other shapes such as a semi-circular shape can be considered. In case where the surface shape of the molten zone is band-like, it is preferable to use a method of focusing energy such as light coming from the melting heater onto the desired region by using, for example, an elliptic mirror, a method of employing a carbon strip heater, and the like. In case of making the surface shape circular, it is recommendable to use a method of employing, as the melt-heating source, energy rays, for example, laser beams and electron beams.

In the present invention, as means to control the dimension of the molten zone to become constant and/or crystal quality of the recrystallized-material-member to become uniform, there are, for example, a combination use of means for measuring the dimension of the molten zone of the crystalline-material-member and means for regulating an amount of energy to be supplied from the melting heater to the crystalline-material-member so that the measured value converges on the preset value, and a combination use of means for measuring a temperature of the molten zone of the crystalline-material-member and means for regulating an amount of energy to be supplied from the melting heater to the crystalline-material-member so that the measured value converges on the preset value.

In case of the above-mentioned surface shape of the molten zone being band-like, it is preferable that the width of the band-like molten zone is from 0.1 to 10 mm, particularly from 1 to 3 mm from the viewpoints of obtaining good appearance of the recrystallized-material-member and making uniform crystal quality. If the width is wider than the above-mentioned range, there is a case where the dimension and temperature of the molten zone cannot be properly controlled, a substrate is melted when used together with the crystalline-material-member, or the crystalline-material-member is separated from an insulator when the both are used together. On the contrary, if the width is narrower than the above-mentioned range, there is a case where the crystalline-material-member cannot be melted or the melting is not sufficient.

In case where the above-mentioned surface shape of the molten zone is circular, it is preferable that the diameter of the circular form molten zone is from several micrometers to several centimeters from the viewpoints of obtaining the recrystallized-material-member having good appearance and uniform crystal quality. In many cases, the diameter is generally controlled to be in the range of 20 to 100 $\mu$m. If the diameter of the molten zone is more than the above-mentioned range, there is a case where the dimension and temperature of the molten zone cannot be properly controlled, a substrate is melted when used together with the crystalline-material-member, or the crystalline-material-member is separated from an insulator ram when the both are used together. On the contrary, when the diameter is less than the above-mentioned range, there is a case where the crystalline-material-member cannot be melted or the melting is not sufficient.

In case of the method of controlling crystal quality of the recrystallized-material-member to be uniform by controlling the dimension of the molten zone to be constant during scanning (during transferring of the melting heater), the width or diameter of the surface shape of the molten zone during scanning is preset to an optional value. From a point of making crystal quality of the crystalline-material-member uniform, it is preferable that the actually measured width or diameter of the molten zone during scanning is controlled to be 80 to 120%, more preferably 95 to 115% of the set value.

In case where the above-mentioned surface shape of the molten zone is band-like, this band-like molten zone is made to be at a right angle to the transfer direction and is moved continuously along the crystalline-material-member, thereby recrystallizing the desired region of the crystalline-material-member. In case of the circular molten zone, the desired region is recrystallized by continuously moving the molten zone along the crystalline-material-member so as to cover the desired region to be recrystallized.

With respect to the melting heater, a single use thereof may suffice, and the use of plural ones makes it possible to recrystallize plural zones of the crystalline-material-member, which contributes to shortening of a recrystallizing time.

As mentioned above, examples of the crystalline material are materials having a crystal structure or amorphous ones. Those crystalline-material-members can be recrystallized or crystallized to obtain a crystal structure having uniform crystal quality through the melting by the method of the present invention.

As the above-mentioned crystalline material, there can be exemplified, for example, semiconductor materials such as silicon, GaAs, InP, Ge, CdS, CdTe and CuInSe$_2$, electrically conductive materials such as C, Fe and Al, insulative materials such as SiO$_2$, Si$_3$N$_4$, Al$_2$O$_3$ and BN, and the like. The above-mentioned crystalline materials such as silicon and GaAs are semiconductor materials and are utilized for LSI devices and solar cells, and the use of the recrystallized-material-member comprising these crystalline materials and produced through the method of the present invention can provide high performance LSI devices and solar cells. The crystalline-material-member is in the form of a sheet like a film, powder, particle, sphere, circular column, square pillar or the like. From the viewpoint of low material cost and easy handling, a sheet-like material is advantageous. Also, from the viewpoint of application to semiconductor devices such as LSI devices and solar cells, it is preferable that a thin film semiconductor, i.e. the crystalline-material-member is a silicon semiconductor.

In case where the crystalline-material-member is the thin film semiconductor, it is preferable, from heat resistance point of view, that this thin film semiconductor is disposed on an insulating substrate. When there is a big difference in the coefficient of thermal expansion between the insulating substrate and the thin film semiconductor, there is a problem such that a great stress arises between the two. In order to eliminate this problem, it is preferable to use the same material or the same kind of material for the two. For example, when the thin film semiconductor employs the silicon semiconductor, it is preferable that the semiconductor substrate is a silicon substrate. This is advantageous from a point that the stress arising between the substrate and the thin film semiconductor becomes small at the time of heat-treating, since the coefficient of thermal expansion of the substrate becomes nearly the same as that of the thin film semiconductor.

Also, from a point of preventing agglomeration of the thin film semiconductor when melted, it is preferable that the above-mentioned thin film semiconductor sandwiched between the insulators is provided on the insulating substrate or semiconductor substrate. With respect to other crystalline-material-members for the thin film semiconductor, it is also preferable, for the same reason, that they are sandwiched between the insulators and subjected to recrystallization treatment.

Also from the viewpoint of heat resistance, heat insulating property and permeability of energy such as light, it is preferable that the above-mentioned insulators are each made up of a silicon oxide film, silicon nitride film or a combination thereof.

The method of producing the recrystallized-material-member of the present invention and the apparatus used therefor are then explained by means of embodiments thereof.

First, Embodiment (A) of the method of producing a recrystallized-material-member and the apparatus therefor are explained using the drawings, wherein dimension of the given molten zone of the crystalline-material-member melted by energy is measured and the molten zone being supplied with energy is moved continuously along the surface of the crystalline-material-member with regulating an amount of energy supplied to the above-mentioned given zone of the crystalline-material-member according to the measured value and keeping the dimension of the molten zone constant.

FIG. 1 is a view illustrating Embodiment (A), wherein there are employed a combination of optical devices, for example, a CCD camera and a width analyzer as means for measuring the dimension of the molten zone of the crystalline-material-member melted by energy, a combination of a PID controller and a power supply device as means for regulating an amount of energy to be supplied, and a thin film semiconductor as the crystalline-material-member.

In FIG. 1, numeral 1 indicates a deposited layer having a thin film semiconductor as the crystalline-material-member; numeral 2 indicates a substrate, numeral 3 indicates a first insulator; numeral 4 indicates a recrystallized zone in the thin film semiconductor; numeral 5 indicates a zone melted by heat treatment on the thin film semiconductor; numeral 6 indicates a zone not subjected to melt treatment on the thin film semiconductor; numeral 7 indicates a second insulator; numeral 8 indicates a quartz chamber; numeral 9 indicates a base heater; numeral 10 indicates a melting heater; numeral 11 indicates an elliptic mirror; numeral 12 indicates a support member; numeral 13 indicates an inspection hole; numeral 14 indicates a filter; numeral 15 indicates a lens; numeral 16 indicates a mirror; numeral 17 indicates a CCD camera; numeral 18 indicates a width analyzer; numeral 19 indicates a PID controller; numeral 20 indicates a power supply device; numeral 21 indicates a CRT; numeral 22 indicates an image of the recrystallized zone of the thin film semiconductor, which is reflected on the CRT; numeral 23 indicates an image of a zone melted by heat treatment on the thin film semiconductor, which is reflected on the CRT; numeral 24 indicates an image of a zone not subjected to melt treatment in the thin film semiconductor, which is reflected on the CRT; numeral 25 indicates an auxiliary line (broken line) illustrating a state of focusing energy generated by the melting heater 10 onto the deposited layer 1 by means of the elliptic mirror 11; numeral 26 indicates an auxiliary line (alternate long and short dash line) illustrating a state of monitoring, with the CCD camera 17, the recrystallized zone, the zone melted by heat treatment and the zone not subjected to melt treatment on the thin film semiconductor; and numeral 27 indicates an arrow indicating a scanning direction of the support member 12 and the mirror 16. In FIG. 1, numerals 1 to 15 are cross-sectional views of the respective portions. In this method, the thin film semiconductor is used as the crystalline-material-member, and is formed into a deposited layer structure and subjected to heat-melting. As the crystalline material, any of those mentioned above can be used, and may be solely subjected to heat melting without being formed into the deposited layer structure.

First, the deposited layer 1 is put in the quartz chamber 8, and then the quartz chamber 8 is filled with an inert gas atmosphere such as $N_2$ gas atmosphere. The deposited layer can be subjected to the above-mentioned heat treatment without being put in the quartz chamber 8 or without filling the quartz chamber 8 with the inert gas atmosphere. However, in that case, there is a case where effects of highly purifying crystals and confining heat cannot be expected.

As the chamber used in the present invention, the quartz chamber is used suitably as mentioned above, and in addition, a stainless steel chamber may be used. In case of the stainless steel chamber, as a heating means, there is a method of providing a heater inside the chamber, and the like, and as means for measuring dimension and temperature of the molten zone of the crystalline-material-member, there is a method of providing the chamber with an observing or monitoring window and measuring through the window. It is preferable that the window is sealed with a material such as quartz.

Also in the present invention, it is not necessary to use the conventional susceptor which has been used to heat a large area uniformly (in the conventional susceptor, there is a case where some portions of it contact the crystalline-material-member and other portions of it do not contact the crystalline-material-member, which obstructs uniform heating). The conventional susceptor is generally made of carbon, and its heat accumulation is very high. For that reason, in case where the crystalline-material-member was heat-treated on the conventional susceptor, there was a problem that it took a long period of time for raising and lowering the temperature of the crystalline-material-member. In other words, since the conventional susceptor may not be used in the method of the present invention, the temperature of the crystalline-material-member can be raised and lowered in a short period of time.

Figure 2:
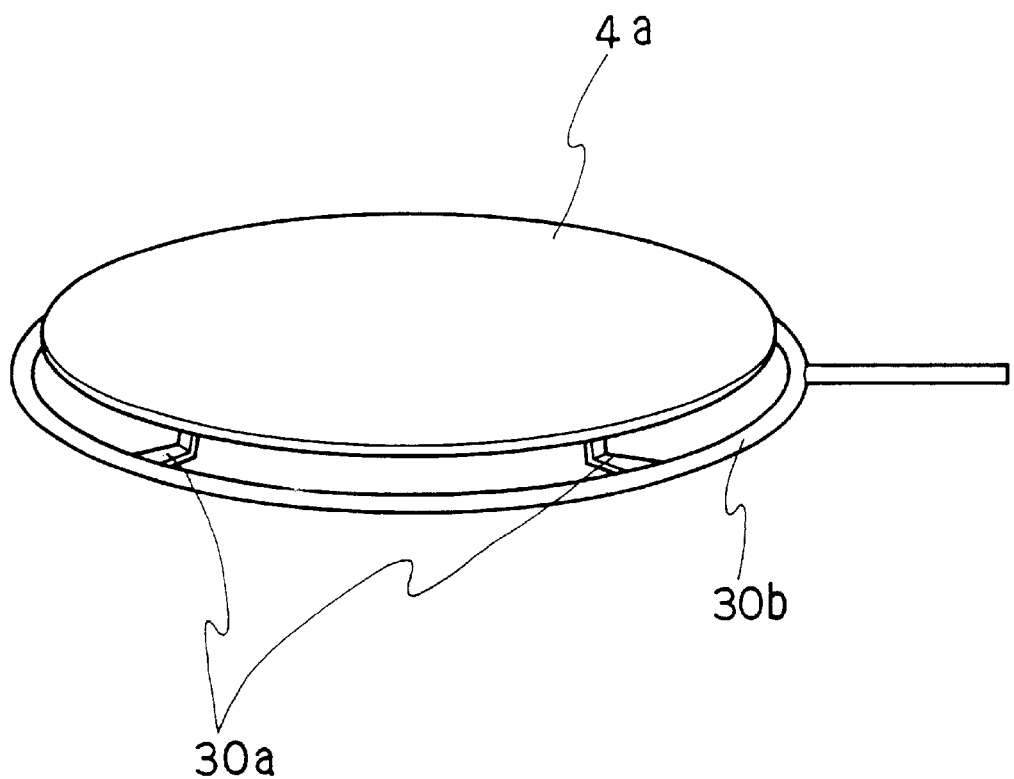
FIG. 2 is a perspective view showing a state of a circular crystalline-material-member being supported by quartz pins.

As shown in FIG. 2, it is preferable that the above-mentioned crystalline-material-member is supported with quartz pins 30a mounted on a quartz ring 30b in view of enhancing heat resistance and heat insulating property and reducing contamination due to impurities. FIG. 2 shows a disc-form crystalline-material-member 4a being supported with the quartz pins. The crystalline-material-member can be supported with the quartz pins irrespective of its shape in the same manner as mentioned above. The shapes of the quartz ring and the quartz pin and the number of quartz pins may be optionally selected. Also, there is a method of supporting the crystalline-material-member with pins made of alumina, SiC or the like instead of quartz.

Also, it is preferable that the whole of the deposited layer 1 is heated by the base heater 9 from the bottom of the quartz chamber 8 from a point of reducing a thermal stress applied to the crystalline-material-member, namely reducing a temperature difference between the molten zone and the unmolten zone (solidified zone and unmolten zone). The heating temperature of the deposited layer 1 by the base heater is not more than the melting point of the crystalline-material-member, i.e. the thin film semiconductor. This heating temperature is optionally selected depending on the kind of the crystalline-material-member. For example, when the crystalline-material-member is silicon material, the heating temperature is usually not less than 1,100° C. and not more than 1,400° C. from the viewpoints of reducing the above-mentioned thermal stress sufficiently and an output of the melting heater.

Figure 3:
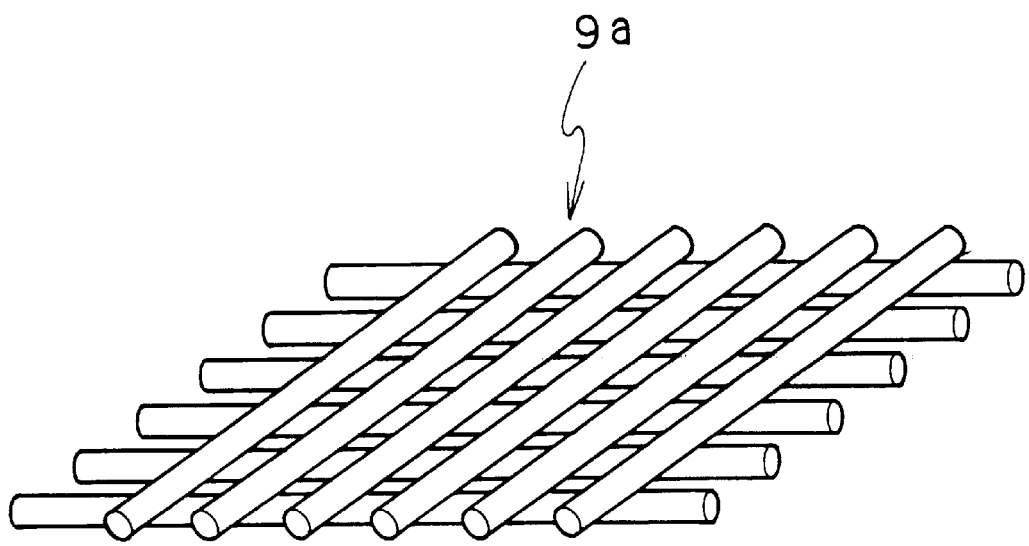
FIG. 3 is a perspective view showing an example of a structure of the base heater.
Figure 4:
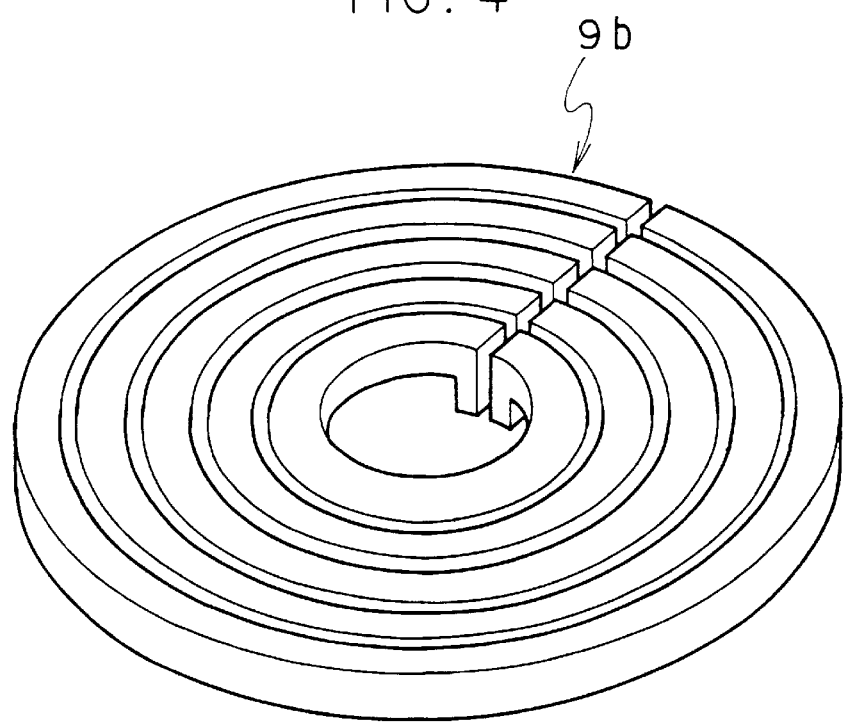
FIG. 4 is a perspective view of another example of the structure of the base heater.

As the base heater 9, there are an IR halogen lamp, carbon heater, RF heater and the like. There are various structures thereof, for example one wherein a plurality of pillar-form heating sources are disposed substantially in plane parallel with each other; one wherein there are two sets of plural pillar-form heating sources disposed in plane parallel with each other, and one set of plural pillar-form heaters are disposed at a right angle to another set of plural pillar-form heating ion sources (An example of a structure of that base heater 9a is shown in FIG. 3); one wherein plural heating sources are combined in the concentric form (An example of a structure of that base heater 9b is shown in FIG. 4), and the like. From heat efficiency point of view, particularly preferable structure is the above-mentioned one wherein two sets of plural pillar-form heating sources disposed substantially in plane parallel with each other, and one set of plural pillar-form heating sources are disposed so as to be substantially at a right angle to another set of plural pillar-form heating sources.

Subsequently, by supplying electric power to the melting heater 10 from the power supply device 20, energies such as thermal energy, optical energy or electronic energy are generated and focused on the surface of the crystalline-material-member by the elliptic mirror 11 through the insulator 7 to partially melt the given zone of the thin film semiconductor, i.e. the crystalline-material-member. In FIG. 1, the crystalline-material-member is heated through the insulator 7, and it goes without saying that it is possible to recrystallize the crystalline-material-member by heating not through the insulator 7.

As the melting heater 10, there are a halogen lamp, carbon strip heater, laser beam, electron beam and the like. Also, when the melting heater is in the form of a pillar, it is possible to make the surface shape of the molten zone band-like. In case where the melting heater is a device for generating energy rays such as laser beams and electron beams, the surface shape of the molten zone can be made circular.

Figure 5:
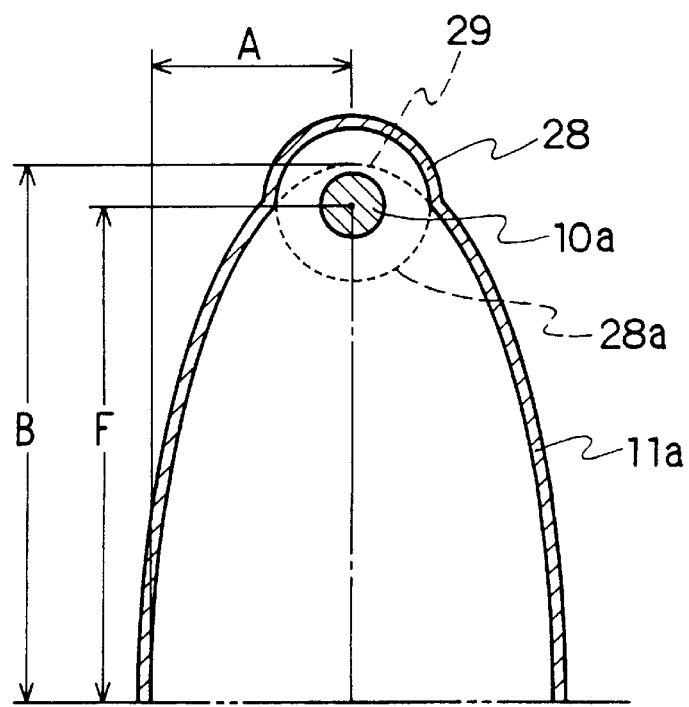
FIG. 5 is a cross-sectional view of an elliptic mirror and the melting heater.

Also in case where the section of the elliptic mirror is an ellipse having a concave with a specific curvature and the concave is produced by extrapolating a circle with the curvature, it is preferable that the center of the circle coincides with one of the focuses of the ellipse (focus at the mirror side) and that the melting heater does not give interference to the elliptic mirror, that is, does not contact the mirror. FIG. 5 shows an example of a sectional form of such an elliptic mirror. In FIG. 5, numeral 11a indicates the elliptic mirror, numeral 10a indicates the melting heater, numeral 28a indicates an auxiliary line illustrating a circle extrapolated and having a part of its circumference corresponding to the concave 28 in the form of a segment, numeral 29 indicates an auxiliary elliptic line for illustrating a major axis of the ellipse, A indicates a length of the minor axis of the ellipse, B indicates a length of the major axis of the ellipse and F indicates a distance from the center of the ellipse to the focus.

It is preferable that the above-mentioned melting heater is in the form of a pillar, particularly a circular column, from a point that the zone supplied with energy, that is, the surface of the molten zone is easily made to be in the band-like form.

In case where the section of the elliptic mirror is an ellipse having a concave with a specific curvature and the concave is produced by extrapolating a circle with the curvature, it is preferable that the center of the circle coincides with one of the focuses of the ellipse (focus at the mirror side) and that assuming the length of the minor axis of the ellipse to be A, the length of the major axis of the ellipse to be B and the radius of the circle to be $R_1$, the radius $R_1$ is represented by the equation: $R_1 = A^2/B$.

Figure 15:
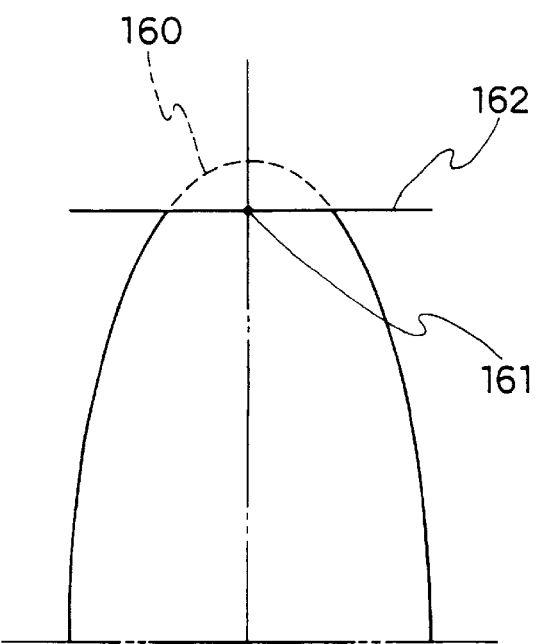
FIG. 15 is an explanatory view showing a drawback of a cross-sectional shape of a conventional elliptic mirror.
Figure 12:
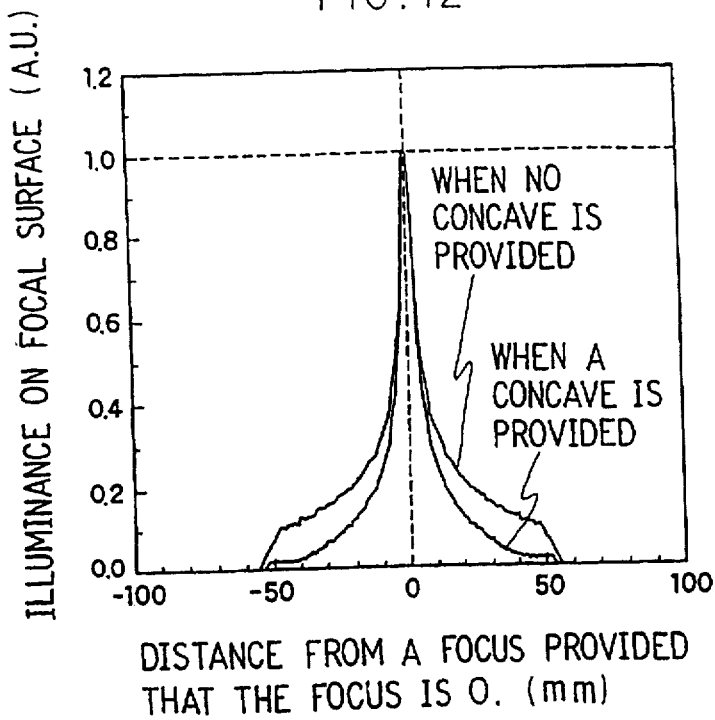
Figure 13:
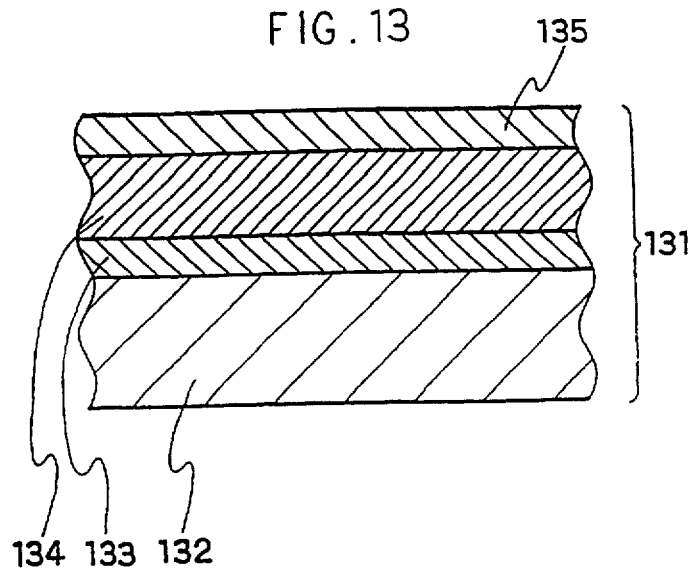

It is preferable, from the viewpoint of light focusing property, that the center of the melting heater is on the focus of the elliptic mirror (or around the focus). When the melting heater is so disposed as mentioned above, in case of the elliptic mirror having no concave as mentioned above, an opposite reflection surface (a portion represented by numeral 160 (dashed line in FIG. 15) on the elliptic circumference at the side far from the center of the ellipse in case where the ellipse is divided by a line 162 passing the focus 161 of the ellipse in parallel with the minor axis of the ellipse as shown in FIG. 15. Hereinafter the same) hardly contributes to the focusing of lights (or concentration of energy). This is because the distance between the melting heater and the opposite reflection surface is too short. Such a problem with the focusing of lights is inhibited by providing a concave on the opposite reflection surface as shown, for example, in FIG. 5 and returning lights irradiated backward to the light source, thus providing a secondary light source which irradiates lights forward (toward the original light source). It is preferable that the above-mentioned concave has the curvature mentioned above. The radius $R_1$ of the circle having such a curvature and the center corresponding to the focus of the ellipse is represented by the equation: $R_1 = A^2/B$.

When the above-mentioned melting heater is in the form of a circular column, the section of the elliptic mirror is an ellipse having a concave with a specific curvature and the concave is produced by extrapolating a circle with the curvature, it is preferable that the center of the circle coincides with one of the focuses of the ellipse and that in case where the length of the minor axis of the ellipse is assumed to be A, the length of the major axis of the ellipse is assumed to be B, and the radius of the melting heater is assumed to be $R_2$, it is preferable that the length B is represented by the equation: $[(A^2/R_2) + R_2]/2 \leq B \leq A^2/R_2$.

When the melting heater having the radius $R_2$ is disposed on the focus of the ellipse, in case of a normal ellipse, there occurs geometrical interference, that is, contact or overlapping when $R_2$ is represented by the equation: $R_2 \geq B - F = B - (B^2 - A^2)^{1/2}$ (wherein F is a distance between the center of the ellipse and the focus). However, this condition is eliminated by providing the above-mentioned concave on the opposite reflection surface. In the present invention, the length B effective for the focusing of lights is represented by the equation: $[(A^2/R_2)+R_2]/2 \leq B \leq A^2/R_2$ (wherein $R_2$ must be $R_2 \leq A^2/B$), and when A, B and $R_2$ are in the range shown by this equation, the focusing of lights is particularly effective.

Then, the dimension of the partly molten zone of the above-mentioned thin film semiconductor is monitored with the CCD camera 17 by using the filter 14, lens 15 and mirror 16 disposed on the inspection hole 13 mounted on the support member 12 and elliptic mirror 11. In FIG. 1, since the melting heater 10 is in the form of a pillar, the surface shape of the molten zone of the thin film semiconductor becomes band-like. Therefore, by measuring the width of that band-like form by using the CCD camera 17, the dimension of the molten zone can be measured. The dimension of the molten zone is preset to an optional value, and is controlled by a PID controller described hereinbelow so as to converge on the preset value.

The magnification of the lens 15 may be optionally selected in view of a relation between the dimension of the molten zone and the resolution of the CCD camera 17. For example, in case where the surface of the molten zone is in the band-like form and the width of the band-like form is controlled to about 2 mm±10% by using a commercially available CCD camera with a ⅔ inch (8.8 mm) CCD element having a horizontal resolution of 570, usually the resolution of about 100 μm is necessary and also the lens magnification is required to be not less than 0.15 time (15 μm/100 μm=0.15) since the resolution of that CCD camera is 15 μm (8.8 mm/570=15 μm). Since the width of the molten zone is necessary to be measured, a field of view larger than that width is required. It is usual to make the field of view be not less than about 120% of the surface width of the molten zone. In that case, the magnification of the lens is necessary to be not more than 3.7 times (8.8 mm/(2 mm×1.20)=3.7).

The filter 14 is provided to reduce an intensity of lights.

It is preferable that the surface of the mirror 16 is subjected to coating properly not to reflect infrared rays irradiated from the molten zone toward the CCD camera. By that coating, the CCD camera can be protected from radiation heat, i.e. infrared rays.

An optical reflectance of the partly molten zone of the above-mentioned thin film semiconductor differs from that of the solid zone thereof, and therefore, the partly molten zone can be monitored with the CCD camera 17. In FIG. 1, though the thin film semiconductor is covered with the insulator 7, most of lights permeates through the insulator and therefore the partly molten zone can be monitored. The partly molten zone monitored through the CCD camera 17 is reflected on the CRT 21 together with the solid zone, and an image signal is treated with the width analyzer 18 to measure the surface width of the molten zone. The data of the measured surface width of the molten zone is sent to the PID controller 19 and compared with the preset value thereof, and then a controlled value for calibrating an output value of the melting heater 10 is calculated. For PID control used for that calculation, for example, P control, I control, D control, P-I control and all the other controllable combinations can be considered. The surface width of the above-mentioned molten zone may be measured by receiving a signal directly from the CCD camera 17 by the width analyzer 18 without using the CRT 21. The controlled value for calibrating the output value of the melting heater 10 is sent to the power supply device 20, and electric power in compliance with the calibrated output value of the melting heater 10 is supplied to the melting heater 10.

Figure 6:
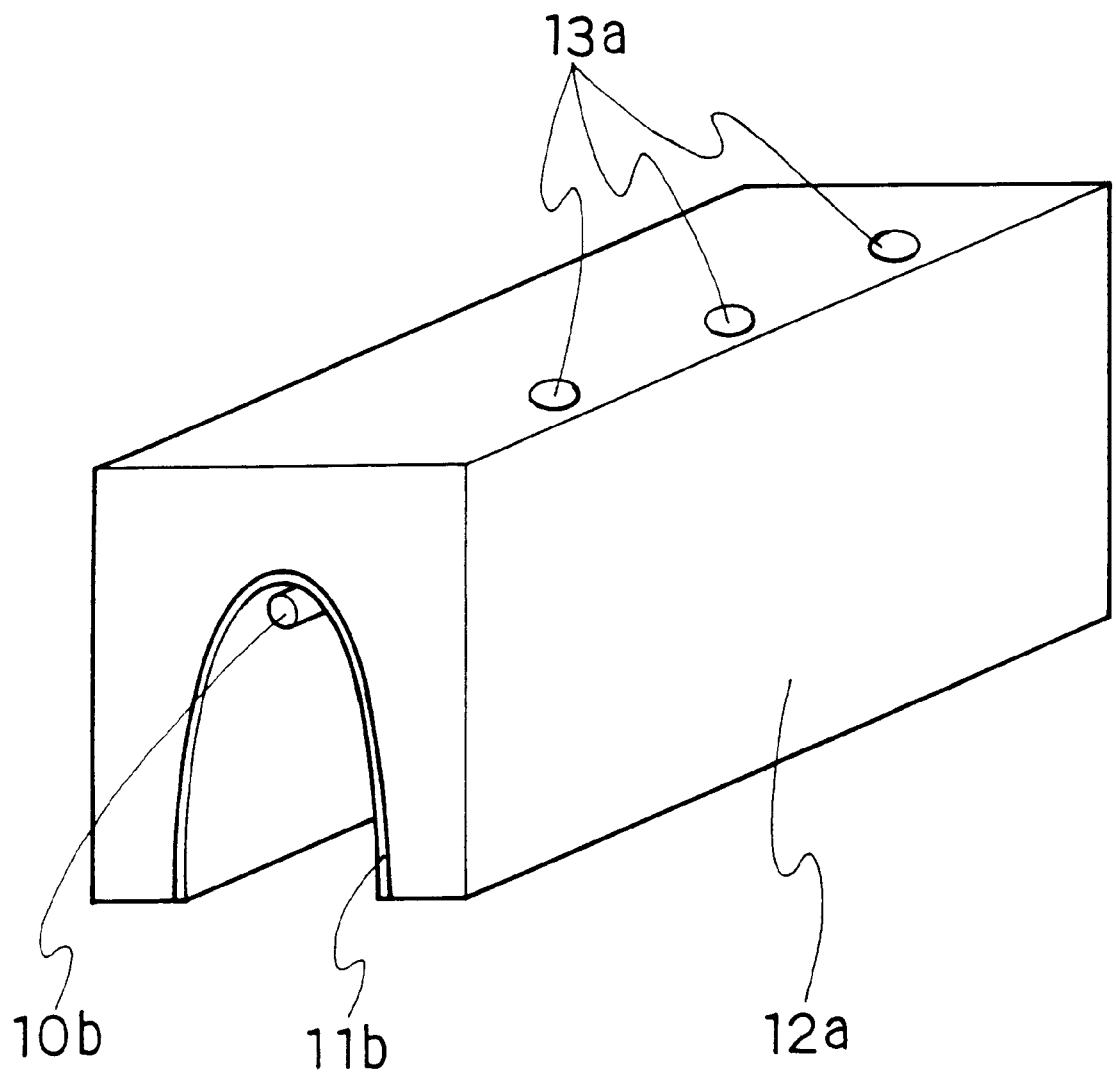
FIG. 6 is a perspective view of the elliptic mirror and a supporting member of the melting heater.

The width of the molten zone may be measured at one point, or may be measured at plural points and the above-mentioned controlling is carried out based on an average value of the measured widths. FIG. 6 illustrates a perspective view of the support member 12a having plural (three) inspection holes 13a. By providing the respective inspection holes with a filter, mirror and CCD camera, the width of the molten zone can be measured at plural points. In FIG. 6, numeral 10b indicates the melting heater and numeral 11b indicates the elliptic mirror.

With controlling the width of the molten zone for calibrating it to the preset value, by moving the support member 12 together with the melting heater 10, elliptic mirror 11, filter 14, lens 15 and mirror 16 toward the direction of an arrow 27, a thin film semiconductor, i.e. a recrystallized-material-member having uniform crystal quality can be obtained even in case where the temperature of the substrate 2 is instable, variation of energy output of the base heater 9 occurs during scanning or variation of a distance between the melting heater 10 and the deposited layer 1 occurs during scanning.

In the present invention, the "crystal quality" means a density of crystal defects or uniformity of crystal orientation such as dislocation cluster, twin, dislocation and sub-grain boundary and the "uniform crystal quality" means that the density of crystal defects is less and the crystal orientation is uniform.

Also in FIG. 1, the support member 12 is moved toward the direction of an arrow 27 together with the melting heater 10, elliptic mirror 11, filter 14, lens 15 and mirror 16, and it is explicit that the same effect can be also obtained by a method of moving the deposited layer 1.

In addition to the above-mentioned Embodiment (A), the intended recrystallized-material-member can be produced by using a method (Embodiment (A-2)) of measuring the dimension of the molten zone of the above-mentioned crystalline-material-member, which is melted by thermal energy, by means of the optical measuring means mentioned above, and then continuously moving the molten zone, with the dimension of the molten zone being kept constant, along the surface of the crystalline-material-member by using means for regulating an amount of energy to be supplied, which controls successively a distance between the melting heater 10 and the deposited layer 1 with a value calculated by the PID controller based on the measured dimension of the molten zone.

In Embodiment (A-2), the distance between the melting heater 10 and the deposited layer 1 may be adjusted by a method (means) of moving up and down the crystalline-material-member or the melting heater, for example by using a drive motor or an air cylinder.

Also the intended recrystallized-material-member can be produced by using a method (Embodiment (A-3)) of measuring the dimension of the molten zone of the above-mentioned crystalline-material-member, which is melted by thermal energy, by means of the optical measuring means mentioned above, and then continuously moving the molten zone along the surface of the crystalline-material-member with the dimension of the molten zone being kept constant by using means for regulating an amount of energy to be supplied, which controls successively a scanning speed of the support member 12 (the melting heater 10, elliptic mirror 11, filter 14, lens 15 and mirror 16 are also scanned) with a value calculated by the PID controller based on the measured dimension of the molten zone.

In the above-mentioned Embodiment (A-3), as the method (means) of regulating the scanning speed, there is, for example, a method of controlling the number of revolutions of an AC servo motor by using a controller.

Figure 7:
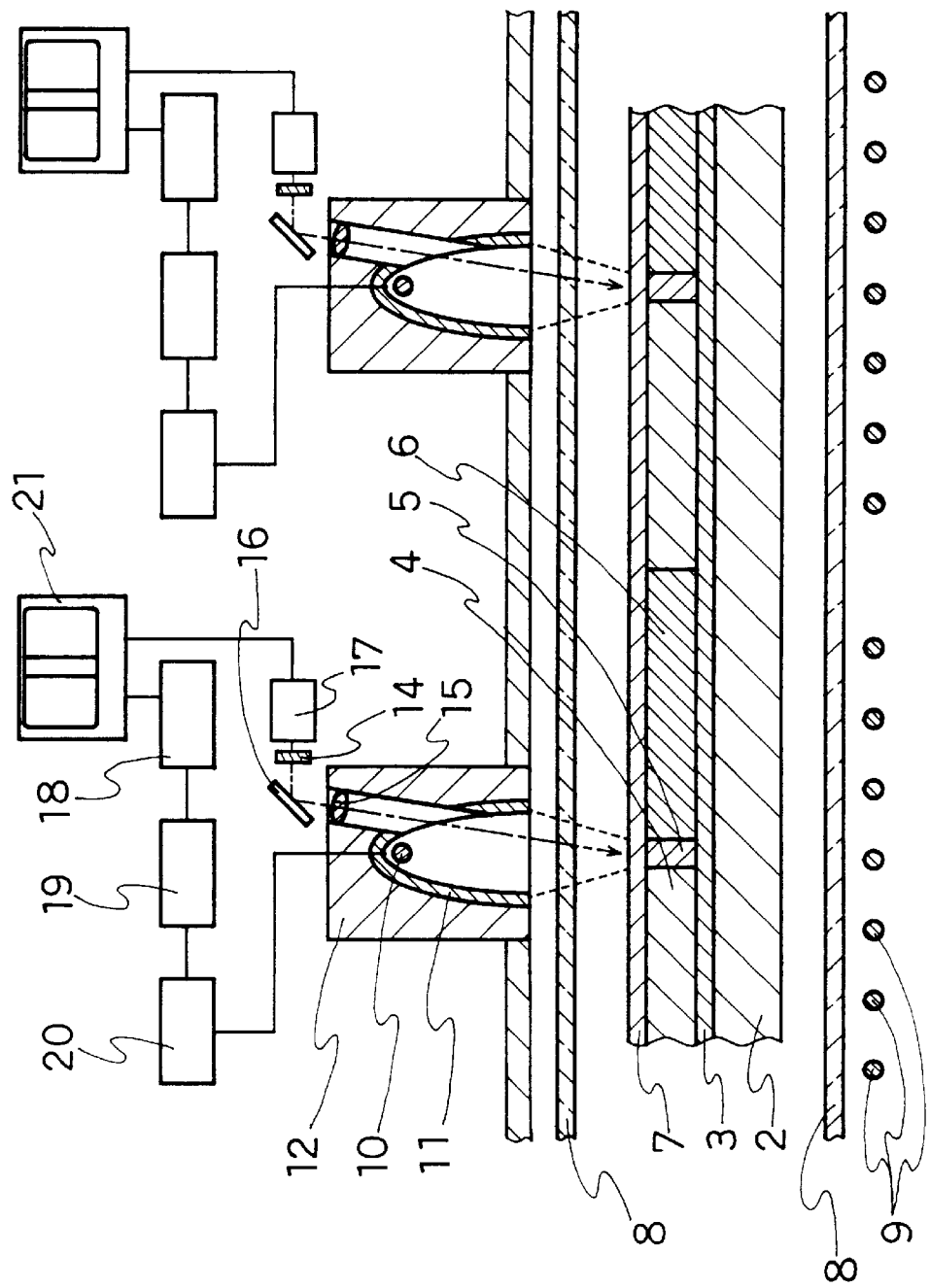
FIG. 7 is an explanatory view of an embodiment of the method of producing recrystallized-material-member by using plural melting heaters.

It is also preferable from time saving point of view to carry out recrystallization by heat-melting the crystalline-material-member at plural points thereof simultaneously by using plural sets of apparatuses comprising the melting heater 10, elliptic mirror 11, support member 12, inspection hole 13, film 14, lens 15, mirror 16, CCD camera 17, width analyzer 18, PID controller 19, power supply device 20 and CRT 21. FIG. 7 is an explanatory view illustrating a method of simultaneously heat-melting plural zones of the crystalline-material-member. In FIG. 7, numerals are the same as those in FIG. 1.

Subsequently, Embodiment (B) of a method of producing a recrystallized-material-member and an apparatus used therefor is explained using the drawing, wherein the temperature of the zone melted by energy of the crystalline-material-member is measured, and with regulating an amount of energy to be supplied to the given zone of the crystalline-material-member based on the measured value, the given zone, to which energy is supplied, is continuously moved along the surface of the crystalline-material-member, with the temperature of the molten zone being kept constant.

Figure 8:
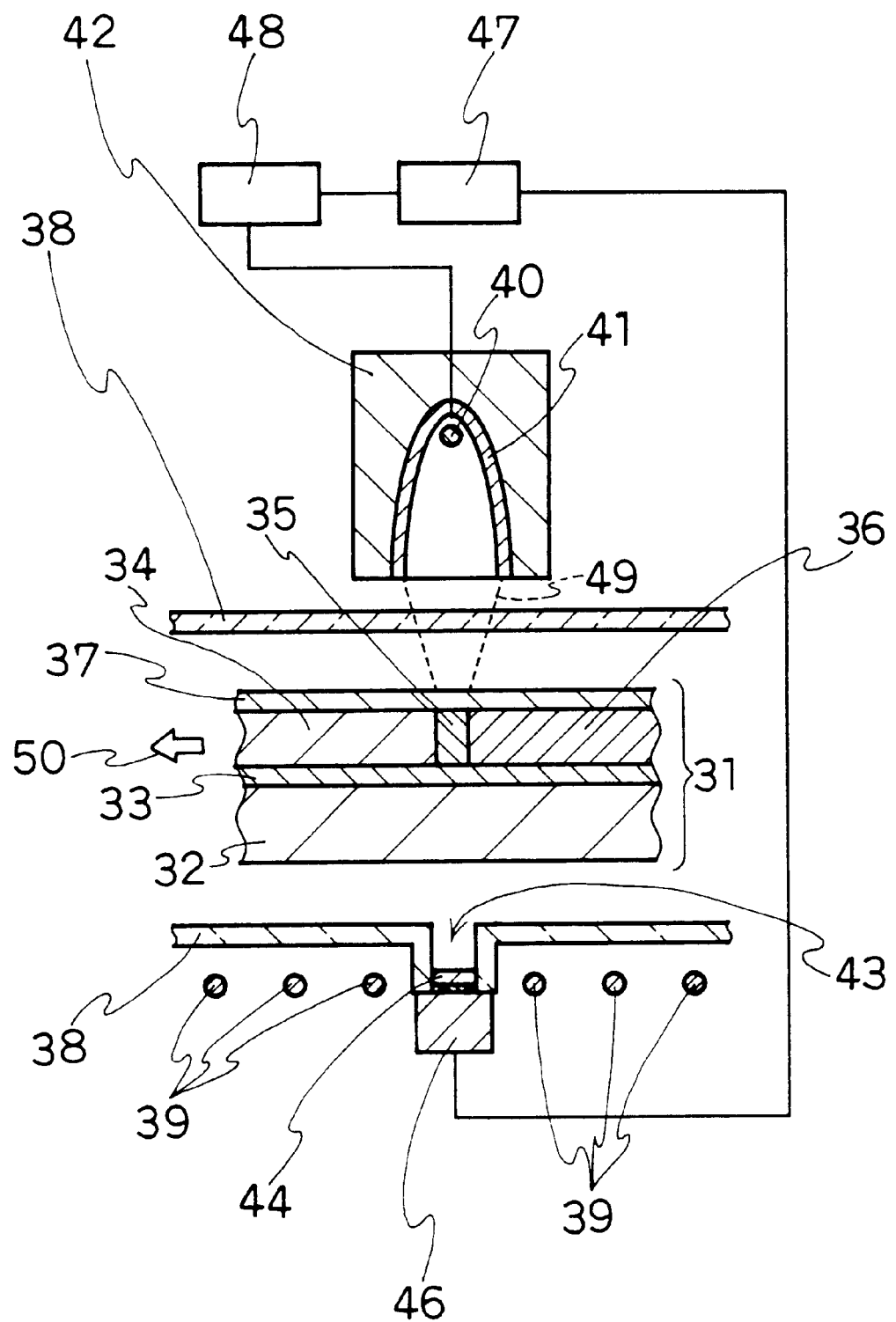
FIG. 8 is an explanatory view of another Embodiment (B) of the method of producing the recrystallized-material-member of the present invention

FIG. 8 is an explanatory view with respect to Embodiment (B). According to FIG. 8, the temperature of the surface on the opposite side of the crystalline-material-member to the surface melting by energy is measured by using a non-contact type pyrometer as means for measuring which is sensitive to infrared rays having a wavelength of not less than 4 $\mu$m, and based on the measured value, the temperature of the zone melting by energy of the crystalline-material-member is controlled through means for regulating an amount of energy to be supplied. The above-mentioned temperature measurement may be carried out on the surface supplied with energy or on the opposite side surface, or in the vicinity of the molten zone. In the Embodiment of the present invention, the temperature of the molten zone is measured from the side opposite to the energy-supplied side. As the means for measuring the temperature, there is, for example, a combination of a spectroscopic filter and a long wavelength pyrometer. Also as the means for regulating energy to be supplied, there is, for example, a combination of a PID controller and a power supply device.

In FIG. 8, numeral 31 indicates a deposited layer having a thin film semiconductor, i.e. a crystalline-material-member, numeral 32 indicates a substrate, numeral 33 indicates a first insulator, numeral 34 indicates a recrystallized zone of the thin film semiconductor, numeral 35 indicates a zone melting by heat treating on the thin film semiconductor, numeral 36 indicates a zone not subjected to melt treatment on the thin film semiconductor, numeral 37 indicates a second insulator, numeral 38 indicates a quartz chamber, numeral 39 indicates a base heater, numeral 40 indicates a melting heater, numeral 41 indicates an elliptic mirror, numeral 42 indicates a support member, numeral 43 indicates a bottom hole of the quartz chamber, numeral 44 indicates a combination of spectroscopic filters, numeral 46 indicates a long wavelength pyrometer, numeral 47 indicates a PID controller, numeral 48 indicates a power supply device, numeral 49 indicates an auxiliary line (dashed line) for illustrating a state of focusing energy generated by the melting heater 40 onto the deposited layer 31 through the elliptic mirror 41 and numeral 50 indicates an arrow indicating a scanning direction of the deposited layer 31. In FIG. 8, the portions represented by numerals 31 to are sectional views, respectively.

In FIG. 8, material and structure of the deposited layer, base heater, melting heater, elliptic mirror and support member, PID controller and power supply device may be the same as those of Embodiment (A).

First, the deposited layer 31 is set in the quartz chamber 38 in the same manner as in the above-mentioned Embodiment (A), and is heated with the base heater 39 in the same manner as in Embodiment (A). The quartz chamber 38 has the bottom hole 43 which is equipped with the spectroscopic filter 44 and ND filter 45 to protect the pyrometer from heat, cut scattered lights and increase measuring sensitivity. The bottom hole 43 is provided with the long wavelength pyrometer 46 which can measure, through the spectroscopic filter 44 and ND filter 45, the temperature of the heat-treated molten zone 35 of the thin film semiconductor from the opposite side of the deposited layer 31.

The long wavelength pyrometer 46 is sensitive to infrared rays having a wavelength of not less than 4 $\mu$m. Though infrared rays having a wavelength longer than 0.2 $\mu$m and shorter than 4 $\mu$m permeate quartz, those having a wavelength of not more than 0.2 $\mu$m and not less than 4 $\mu$m are absorbed therein. The melting heater 40 and base heater 39 are disposed outside the quartz chamber, and the quartz chamber absorbs infrared rays irradiated from those heating sources and having a wavelength of not more than 0.2 $\mu$m and not less than 4 $\mu$m. The quartz chamber also absorbs rays generated from other disturbing lights and having a wavelength of not more than 0.2 $\mu$m and not less than 4 $\mu$m, in addition to those from the melting heater 40 and base heater 39. For that reason, by measuring, in the quartz chamber, the temperature of the heat-treated molten zone 35 of the crystalline-material-member with the long wavelength pyrometer 46 which is sensitive to infrared rays having a wavelength of not less than 4 $\mu$m, there is no case where infrared rays generated from the melting heater 40 and base heater 39 and those from disturbing lights become noises. Thus the temperature of the heat-treated molten zone 35 of the thin film semiconductor can be measured accurately.

Then electric power is supplied to the melting heater 40 to partly heat and melt the thin film semiconductor of the deposited layer 31. The temperature of the molten zone 35 is measured from the opposite side of the deposited layer 31, and the measured value is sent to the PID controller 47. The temperature of the molten zone 35 is preset to an optional value, and the PID controller 47 compares the measured value with the preset value and calculates a controlled value for calibrating an output value of the melting heater 40. This controlled value is sent to the power supply device 48 and then electric power corresponding to the calibrated output value of the melting heater 40 is supplied to the melting heater 40.

With continuing control to calibrate the temperature of the molten zone to the preset value thereof, by moving the deposited layer 31 in the scanning direction indicated by the arrow 50, the thin film semiconductor, i.e. recrystallized-material-member having uniform crystal quality can be obtained even in case where the temperature of the substrate 32 is instable, variation of an energy output of the base heater 39 occurs during scanning or variation of a distance between the melting heater 40 and the deposited layer 31 occurs during scanning.

The set value of the temperature of the molten zone (or adjacent zone thereof) varies depending on the kind of the crystalline-material-member and may be optionally selected. For example, when the crystalline-material-member is a silicon material, the above-mentioned set value may be usually from about 1,400° C. to about 1,500° C. It is preferable that the control range of the actually measured value is the set value plus and minus about 1° C.

Also the intended recrystallized-material-member can be produced by fixing the deposited layer 31 and moving the whole apparatus comprising the base heater 39, melting heater 40, elliptic mirror 41, support member 42, quartz chamber 38 and long wavelength pyrometer 46.

In addition to the above-mentioned Embodiment (B), the intended recrystallized-material-member can be produced by using a method (Embodiment (B-2)) of measuring the temperature of the molten zone of the above-mentioned crystalline-material-member, which is melted by energy, by means of the measuring means mentioned above, and then continuously moving the molten zone along the surface of the crystalline-material-member with the temperature of the molten zone being kept constant by using means for regulating an amount of energy to be supplied, which regulates successively a distance between the melting heater 40 and the deposited layer 31 with a value calculated by the PID controller based on the measured temperature of the molten zone.

As the method (means) for continuously moving the given zone of the crystalline-material-member, where energy is supplied, with regulating a distance between the melting heater 40 and the deposited layer 31, there is the same method (means) as in Embodiment (A-2).

Also the intended recrystallized-material-member can be produced by using a method (means) (Embodiment (B-3)) of measuring the temperature of the molten zone of the above-mentioned crystalline-material-member, which is melted by energy, by means of the measuring means mentioned above, and then continuously moving the molten zone along the surface of the crystalline-material-member with the temperature of the molten zone being kept constant by using means for regulating an amount of energy to be supplied, which regulates successively a scanning speed of the deposited layer 31 with a value calculated by the PID controller based on the measured temperature of the molten zone.

As the method (means) for continuously moving the given zone of the crystalline-material-member along the surface thereof with regulating successively the scanning speed of the deposited layer 31, there is exemplified the same method (means) as in the above-mentioned Embodiment (A-2).

Then the other Embodiment (C) with respect to the method of producing a recrystallized-material-member and the apparatus used therefor is explained below using the drawings, wherein the dimension of the molten zone of the crystalline-material-member melted by energy is measured and with regulating an amount of energy which is supplied to the given zone on the surface of the crystalline-material-member, to be constant based on the measured value, the molten zone is continuously moved along the crystalline-material-member.

Figure 9:
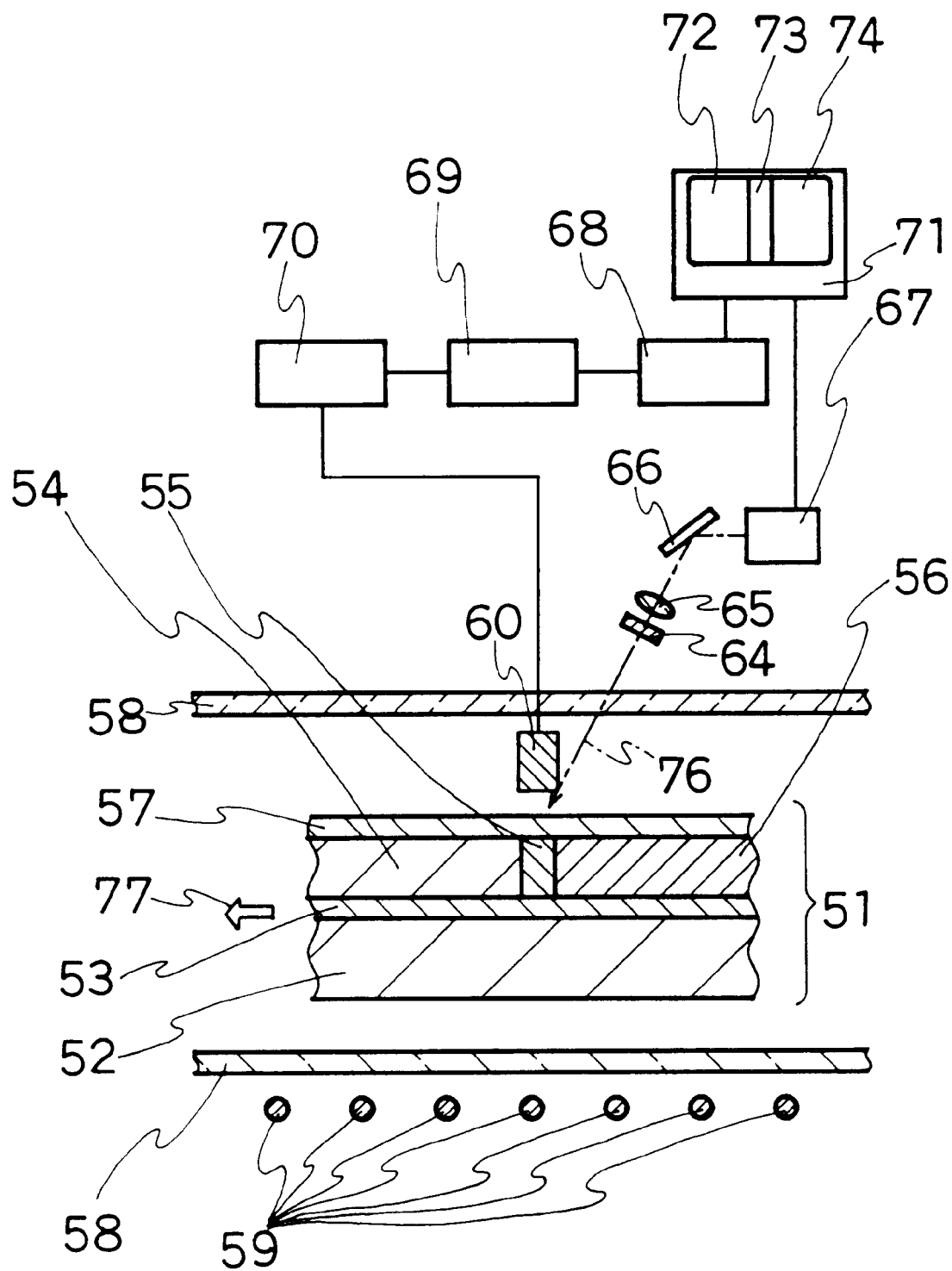
FIG. 9 is an explanatory view of the other Embodiment (C) of the method of producing the recrystallized-material-member of the present invention.

FIG. 9 is a view illustrating a production method of the above-mentioned Embodiment (C) and an apparatus used therefor, wherein the CCD camera and the width analyzer are used for measuring the dimension of the molten zone of the crystalline-material-member and the semiconductor material is used as the crystalline-material-member.

In FIG. 9, numeral 51 indicates a deposited layer including a thin film semiconductor which is a crystalline-material-member, numeral 52 indicates a substrate, numeral 53 indicates a first insulator, numeral 54 indicates a recrystallized zone of the thin film semiconductor, numeral 55 indicates a heat-treated molten zone of the thin film semiconductor, numeral 56 indicates an unmolten zone of the thin film semiconductor, numeral 57 indicates a second insulator, numeral 58 indicates a quartz chamber, numeral 59 indicates a base heater, numeral 60 indicates a melting heater, numeral 64 indicates a filter, numeral 65 indicates a lens, numeral 66 indicates a mirror, numeral 67 indicates a CCD camera, numeral 68 indicates a width analyzer, numeral 69 indicates a PID controller, numeral 70 indicates a power supply device, numeral 71 indicates a CRT, numeral 72 indicates an image of a recrystallized zone of the thin film semiconductor, which is reflected on the CRT, numeral 73 indicates an image of the heat-treated molten zone of the thin film semiconductor, which is reflected on the CRT, numeral 74 indicates an unmolten zone of the thin film semiconductor, which is reflected on the CRT, numeral 76 indicates an auxiliary line (alternate long and short dash line) illustrating a state of monitoring, with the CCD camera 67, the recrystallized zone, molten zone and unmolten zone of the thin film semiconductor, and numeral 77 indicates an arrow indicating a scanning direction of the deposited layer 51. The deposited layer, substrate, first and second insulators, quartz chamber, base heater, filter, lens, mirror, CCD camera, width analyzer, PID controller, power supply device and CRT may be the same as those of Embodiment (A).

In the present Embodiment, as shown in FIG. 9, by providing the melting heater 60 in the neighborhood of the deposited layer 51, the thin film semiconductor is partly heated and melted. For that reason, the elliptic mirror used in Embodiment (A) is not necessary.

It is preferable that the melting heater 60 has a pillar-form and is made of carbon, tungsten, or the like having a high melting point. Also it is preferable that the distance between the deposited layer 51 and the melting heater 60 is about several millimeters. The melting heater 60 is disposed in the quartz chamber 58.

As mentioned above, with continuing control to calibrate the surface width of the molten zone to the preset value, by using adjusting means for moving the deposited layer 51 toward the scanning direction 77, the crystalline-material-member is recrystallized. The intended recrystallized-material-member can be produced also by fixing the deposited layer 51 and using adjusting means for moving the melting heater 10, CCD camera 67, mirror 66, lens 65 and filter 64.

The intended recrystallized-material-member can be produced by continuously moving the molten zone of the crystalline-material-member along the surface thereof with the width of the molten zone being kept constant, wherein the dimension of the molten zone of the crystalline-material-member is measured with the above-mentioned measuring means and adjusting means for continuously moving the molten zone supplied with energy in the crystalline-material-member along the surface of the crystalline-material-member is used with calibrating, based on a value calculated by the PID controller using the above-mentioned measured value, an amount of electric power to be supplied to the melting heater 60 from the power supply device 70. As the adjusting means for calibrating electric power to be supplied to the melting heater 60 based on the measured dimension of the heat-treated molten zone 55 of the thin film semiconductor, which is measured by the above-mentioned measuring means, there is the same adjusting means as in Embodiment (A).

In addition to Embodiment (C), the intended recrystallized-material-member can be produced also by using adjusting means (Embodiment (C-2)) for continuously moving the molten zone of the crystalline-material-member along the surface of the crystalline-material-member with the dimension of the molten zone being kept constant and also by using means for regulating successively a distance between the melting heater 60 and the deposited layer 51 through a value calculated by the PID controller based on the measured dimension of the molten zone of the crystalline-material-member, which is measured with the above-mentioned measuring means.

As the adjusting means for continuously moving the zone supplied with energy along the surface of the crystalline-material-member with regulating successively the distance between the melting heater 60 and the deposited layer 51, there is the same adjusting means as in Embodiment (A-2).

The intended recrystallized-material-member can also be produced by using adjusting means (Embodiment (C-3)) for continuously moving the molten zone of the crystalline-material-member along the crystalline-material-member with the dimension of the molten zone being kept constant by regulating the scanning speed of the deposited layer 51 with a value calculated by the PID controller based on the dimension of the molten zone of the crystalline-material-member, which is measured with the above-mentioned measuring means.

As the adjusting means for continuously moving the energy-supplied zone along the surface of the crystalline-material-member with regulating successively the scanning speed of the deposited layer 51, there is the same adjusting means as in the above-mentioned Embodiment (A-3).

Subsequently, yet another Embodiment (D) with respect to a method of producing a recrystallized-material-member and an apparatus used therefor is explained using the drawings, in which the molten zone of the crystalline-material-member is continuously moved along the surface of the crystalline-material-member with the dimension of the molten zone being kept constant and an amount of energy to be supplied to the molten zone is controlled to be a specified value based on the measured dimension of the molten zone of the crystalline-material-member.

Figure 10:
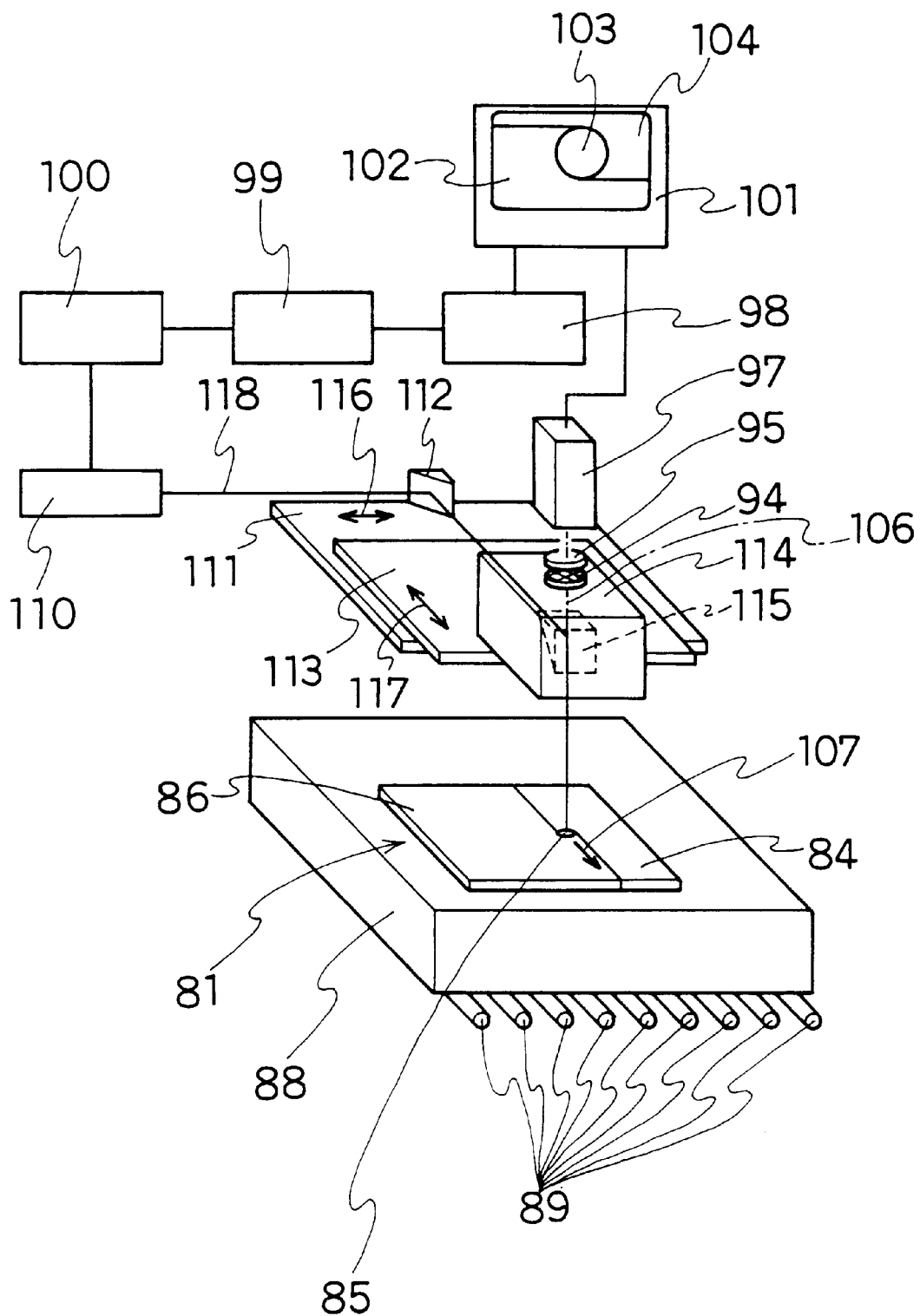
FIG. 10 is an explanatory view of the other Embodiment (D) of the method of producing the recrystallized-material-member of the present invention.

FIG. 10 is an explanatory view of the method and apparatus of Embodiment (D). This figure shows an example of melting the crystalline-material-member with laser beams as a melting heater, measuring the dimension of the molten zone with a CCD camera and image processing equipment as optical means and using a thin film semiconductor as the crystalline-material-member.

In FIG. 10, numeral 81 indicates a deposited layer comprising a substrate, a first insulator, a thin film semiconductor and a second insulator (In FIG. 10, only the thin film semiconductor is shown for easy illustration. The thin film semiconductor in the deposited layer 81 comprises the portions 84, 85 and 86), numeral 84 indicates a recrystallized zone of the thin film semiconductor, numeral 85 indicates a molten zone of the thin film semiconductor, which is melted by heat treatment, numeral 86 indicates an unmolten zone of the thin film semiconductor, numeral 88 indicates a quartz chamber, numeral 89 indicates a base heater, numeral 94 indicates a filter, numeral 95 indicates a lens, numeral 97 indicates a CCD camera, numeral 98 indicates an image processing equipment, numeral 99 indicates a PID controller, numeral 100 indicates a power supply device, numeral 101 indicates a CRT, numeral 102 indicates an image of the recrystallized zone of the thin film semiconductor, which is reflected on the CRT, numeral 103 indicates an image of the heat-treated molten zone of the thin film semiconductor, which is reflected on the CRT, numeral 104 indicates an image of the unmolten zone of the thin film semiconductor, which is reflected on the CRT, numeral 106 indicates an auxiliary line (alternate long and short dash line) illustrating a state of monitoring the recrystallized zone, molten zone and unmolten zone of the thin film semiconductor with the CCD camera 97, numeral 107 indicates an arrow indicating the scanning direction of a laser beam, numeral 110 indicates a laser, numeral 111 indicates a first moving stage, numeral 112 indicates a mirror fixed on the first moving stage, numeral 113 indicates a second moving stage, numeral 114 indicates a mirror box fixed on the second moving stage, numeral 115 indicates a half mirror set in the mirror box, numeral 116 indicates a movable direction of the first moving stage, numeral 117 indicates a movable direction of the second moving stage, and numeral 118 indicates a laser beam. The deposited layer, quartz chamber, base heater, filter, lens, mirror, CCD camera, PID controller, power supply device and CRT may be the same as those for Embodiment (A).

First, the deposited layer 81 is set in the quartz chamber 88 in the same manner as in Embodiment (A), and the thin film semiconductor is heated with the base heater 89 in the same manner as in Embodiment (A).

Then, electric power is supplied to the laser 110 from the power supply device 100 to generate the laser beam 118. The laser beam 118 is reflected on the mirror 112 and the half mirror 115 and irradiated to the surface of the deposited layer 81 to partly melt the deposited layer 81. The heat-treated molten zone 85 of the thin film semiconductor is monitored with the CCD camera 97 through the half mirror 115. The partly molten zone can be monitored with the CCD camera 97 because a reflectance of the partly molten zone differs from that of the solid zone. The partly molten zone monitored with the CCD camera 97 is reflected on the CRT 101 together with the solid zone, and an image signal processing is carried out with the image processing equipment 98 to measure a diameter of the surface of the molten zone (diameter of a circular zone of the deposited layer 81, which is melted with the laser beam 118). The data of the measured diameter of the surface of the molten zone is sent to the PID controller 99, where the sent data is compared with the preset diameter to calculate a controlled value for calibrating an amount of electric power to be supplied to the laser 110. As the PID control used for that calculation, the same combination as that of Embodiment (A) can be considered.

The signal from the CCD camera 97 may be directly received by the image processing equipment 98 (signal processing unit) to measure the diameter of the molten zone without using the CRT 101.

The controlled value for calibrating an amount of electric power to the laser 110 is sent to the power supply device 100, and electric power corresponding to the calibrated output value of the laser 110 is supplied to the laser.

With continuing the control as mentioned above by using the adjusting means for calibrating the diameter of the molten zone to the preset value, by properly moving an irradiation point of the laser beam 118 along the surface of the deposited layer 81, the thin film semiconductor, i.e. recrystallized-material-member having uniform crystal quality can be obtained, for example, even in case where variation of an energy output of the base heater 89 occurs during irradiation of the laser beam 118. The irradiation point of the laser beam 118 may be moved through proper method so as to enable the desired region of the deposited layer 81 to be recrystallized.

The irradiation point of the laser beam 118 can be moved by moving the first moving stage 111 and the second moving stage 113 toward the movable direction 116 and moving the second moving stage toward the movable direction 117. The second moving stage 113 is disposed on the first moving stage 111 so as to be movable in the direction 117. The mirror box 114 is fixed to the second moving stage 113, and the laser 110, lens 95 and filter 94 are fixed to the mirror box 114.

In addition to the above-mentioned Embodiment (D), the intended recrystallized-material-member can also be produced by using a method (Embodiment (D-2)) of measuring the diameter of the molten zone of the crystalline-material-member melted by the above-mentioned energy with the above-mentioned measuring means, and then moving the irradiation point of the laser beam 118 along the surface of the crystalline-material-member with keeping the diameter of the molten zone constant and with regulating successively the moving speed of the irradiation point of the laser beam 118 with a value calculated by the PID controller based on the measured diameter.

In Embodiment (D-2), in order to regulate successively the moving speed of the irradiation point of the laser beam 118, for example, means for properly controlling the moving speeds of the first moving stage and/or the second moving stage may be used.

Also there may be used adjusting means for moving the irradiation point of the laser beam 118 by moving the deposited layer 81 at an optional speed in an optional direction.

A method of producing the recrystallized-material-member of the present invention employs a heating method mentioned below, namely, the heating method using an elliptic mirror and a melting heater, in which the section of the elliptic mirror is an ellipse having a concave with a specific curvature, and in case where the concave is produced by extrapolating a circle with the curvature, the center of the circle coincides with one of the focuses of the ellipse and the melting heater does not give interference to the elliptic mirror.

Also in the above-mentioned heating method, it is preferable that the section of the elliptic mirror is an ellipse having a concave with a specific curvature, and that in case where the concave is produced by extrapolating a circle with the curvature, the center of the circle coincides with one of the focuses of the ellipse and when assuming the length of the minor axis of the ellipse to be "A", the length of the major axis of the ellipse to be "B" and the radius of the circle to be "$R_1$", the radius $R_1$ is represented by the equation: $R_1 = A^2/B$.

Also, in the above-mentioned heating method, it is preferable that the melting heater is in the form of a circular column and the section of the elliptic mirror is an ellipse having a concave with a specific curvature, and that in case where the concave is produced by extrapolating a circle with the curvature, the center of the circle coincides with one of the focuses of the ellipse and when assuming the length of the minor axis of the ellipse to be "A", the length of the major axis of the ellipse to be "B" and the radius of the bottom surface of the melting heater to be "$R_2$", the length B is represented by the equation: $[(A^2/R_2)+R_2]/2 \leq B \leq A^2/R_2$.

Also, in the above-mentioned heating method, it is preferable that the melting heater is in the form of a circular column and the section of the elliptic mirror is an ellipse having a concave with a specific curvature, and that in case where the concave is produced by extrapolating a circle with the curvature, the center of the circle coincides with one of the focuses of the ellipse and when assuming the length of the minor axis of the ellipse to be "A", the length of the major axis of the ellipse to be "B", the radius of the circle to be "$R_1$" and the radius of the bottom surface of the melting heater to be "$R_2$", the radius $R_1$ of the circle is represented by the equation: $R_1 = A^2/B$ and the length B is represented by the equation: $[(A^2/R_2)+R_2]/2 \leq B \leq A^2/R_2$.

The method of producing a recrystallized-material-member of the present invention is a concrete embodiment of the above-mentioned heating method.

The present invention is further explained concretely by means of examples.

EXAMPLE 1

Example 1 is explained based on Embodiment (A) by using FIGS. 1 to 4.

A deposited layer 1 was produced by using a silicon substrate having a thickness of several hundred micrometers to several millimeters as the substrate 2; an about 1 μm thick oxidized film formed through thermal oxidation method or LP-CVD method as the first insulator 3; an about several micrometer thick polysilicon film as a thin film semiconductor 4; and as the second insulator 5, the same oxidized film as the first insulator, which has a thickness of about 1 to 2 μm or the same oxidized film on which, for example, a silicon nitride film having a thickness of about 300 Å was provided through LP-CVD method. The second insulator mentioned above is provided to prevent agglomeration of the thin film semiconductor 4.

Subsequently, the deposited layer 1 was supported with a quartz ring 31 with quartz pins 30 at three points as shown in FIG. 2, and was set in the quartz chamber 8 as shown in FIG. 1.

The deposited layer 1 was then heated to 1,100° to 1,400° C. from outside of the quartz chamber 8 by using the base heater 9. The base heater 9 having the form shown in FIG. 3 or 4 was used. The deposited layer 1 could be rapidly heated because it was disposed in the quartz chamber 8 without using a susceptor.

For an apparatus for recrystallization, there were employed a halogen infrared lamp as the melting heater 10; an elliptic mirror having a layer of gold plating as the elliptic mirror 11; a filter combined with an ND filter as the filter 14; a lens having a magnification of ×0.15 to ×3.7 as the lens 15; a mirror subjected to coating so as to permeate infrared rays and reflect only visible rays as the mirror 16; and a commercially available CCD camera having a resolution of 570 as the CCD camera; and also the apparatus was equipped with the width analyzer 18, PID controller 19, power supply device 20 and CRT 21.

Recrystallization was carried out through the method of Embodiment (A) by setting the width of the zone 5 to be recrystallized of the thin film semiconductor at 1 to 3 mm and controlling the actual width to be in the range of ±5% to ±20% of the set width, and by setting the scanning speed at 0.1 to 5.0 mm/sec.

The crystal quality of the thin film semiconductor recrystallized under the above-mentioned range of the -conditions was uniform enough.

Recrystallization was also carried out by using the same apparatus and the same set values in accordance with the methods of Embodiments (A-1) and (A-2), and as a result, the crystal quality of the recrystallized thin film semiconductor was uniform enough.

As shown in FIG. 7, recrystallization time can be shortened by using plural sets of the same apparatuses.

EXAMPLE 2

Example 2 based on Embodiment (B) is explained below by using FIG. 8.

The deposited layer 31 produced in the same manner as in Example 1 was supported at three points by the same quartz ring with quartz pins as in Example 1 and set in the quartz chamber 38 as shown in FIG. 8.

The deposited layer 31 was then heated to 1,100° to 1,400° C. from outside of the quartz chamber 38 with the same base heater 39 as that used in Example 1.

For an apparatus used for recrystallization, there were employed a halogen infrared lamp as the melting heater 40; elliptic mirror having a layer of gold plating as the elliptic mirror 41; $BaF_2$ as the spectroscopic filter 44; and a long wavelength pyrometer which is sensitive to infrared rays having a wavelength of not less than 4 μm as the long wavelength pyrometer, and also the apparatus was equipped with the PID controller 47 and power supply device 48.

Recrystallization of the thin film semiconductor was carried out through the method of Embodiment (B) by setting the temperature of the zone 35 to be recrystallized at 1,410° to 1,415° C. and controlling the actual temperature so as to be in the range of ±0.1° C. to plus ±2° C. of the set temperature.

Crystal quality of the thin film semiconductor recrystallized under the above-mentioned conditions was uniform enough.

Also recrystallization was carried out by the methods of Embodiments (B-1) and (B-2) by using the same apparatus and the same set values, and the crystal quality of the recrystallized thin film semiconductor was uniform enough.

EXAMPLE 3

Example 3 based on Embodiment (C) is explained below by using FIG. 9.

A deposited layer 51 produced in the same manner as in Example 1 was supported at three points with the same quartz ring with quartz pins as in Example 1, and was set in the quartz chamber 58 as shown in FIG. 9.

The deposited layer 51 was then heated from outside of the quartz chamber 58 to 1,100° to 1,400° C. by means of the same base heater 59 as in Example 1.

For an apparatus for recrystallization, there were employed a pillar-form carbon or tungsten as the melting heater 60; a filter combined with an ND filter as the filter 64; a lens having a magnification of ×0.15 to ×3.7 as the lens 65; a mirror subjected to coating so as to permeate infrared rays and reflect only visible rays, as the mirror 66, and a commercially available CCD camera having a resolution of 570 as the CCD camera 67, and also the apparatus was equipped with the width analyzer 68, PID controller 69, power supply device 70 and CRT 71.

Recrystallization was carried out through the method of Embodiment (C) by setting the width of the zone 55 to be recrystallized at 1 to 3 mm and controlling the actual width to be in the range of ±5% to ±20% of the set width.

The crystal quality of the thin film semiconductor recrystallized under the above-mentioned conditions was uniform enough.

Recrystallization was also carried out by using the same apparatus and the same set values in accordance with the methods of Embodiments (C-1) and (C-2), and as a result, the crystal quality of the recrystallized thin film semiconductor was uniform enough.

EXAMPLE 4

Example 4 based on Embodiment (D) is explained below by using FIG. 10.

The same thin film semiconductor 81 as in Example 1 was supported at three points with the same quartz ring with quartz pins as in Example 1, and was set in the quartz chamber 88 as shown in FIG. 10.

The thin film semiconductor 81 was then heated from outside of the quartz chamber 88 to 400° to 600° C. by means of the same base heater 89 as in Example 1.

For an apparatus for recrystallization, there were employed a CW argon laser as the laser 110; a filter combined with an ND filter as the filter 94; a lens having a magnification of ×0.15 to ×3.7 as the lens 95; and a commercially available CCD camera having a resolution of 570 as the CCD camera 97, and also the apparatus was equipped with a first moving stage 111, a mirror 112 fixed to the first moving stage, a second moving stage 113, a mirror box 113 fixed to the second moving stage, a half mirror 115 set on the mirror box, an image processing equipment 98, a PID controller 99, a power supply device 100 and a CRT 101.

Recrystallization was carried out through the method of Embodiment (D) at a scanning speed of 5 to 25 cm/sec by setting the diameter of the zone 85 to be recrystallized at 20 to 100 μm and controlling the actual diameter to be in the range of ±5% to ±20% of the set diameter.

The crystal quality of the thin film semiconductor recrystallized under the above-mentioned conditions was uniform enough.

Recrystallization was also carried out by using the same apparatus and the same set values in accordance with the method of Embodiment (D-1), and as a result, the crystal quality of the recrystallized thin film semiconductor was uniform enough.

EXAMPLE 5

The degree of improvement in light focusing property of the elliptic mirror used in Example 1 was evaluated by providing a specific concave on its ellipse.

FIG. 5 shows a section of the elliptic mirror having the concave. As explained in Embodiment (A), this mirror has a concave 28, and the center of a circle illustrated with that concave and an auxiliary line 28a coincides with a focus of the ellipse. In case where in the section of the elliptic mirror, the length of minor axis of the ellipse is assumed to be "A", the length of major axis of the ellipse is assumed to be "B" and a radius of the above-mentioned circle is assumed to be "$R_1$", this radius $R_1$ is represented by the equation: $R_1 = A^2/B$. Further in case where a radius of the melting heater is assumed to be $R_2$, the above-mentioned length B of the major axis of the ellipse is represented by the equation: $[(A^2/R_2)+R_2]/2 \leq B \leq A^2/R_2$, and thus light focusing property can be improved.

The difference in light focusing property which was caused depending on whether or not there is the above-mentioned concave, was evaluated in case where the length A of the minor axis of the ellipse and the length B of the major axis were assumed to be 24.2 mm and 65 mm, respectively. The center of the above-mentioned circular concave was adjusted to coincide with one focus of the ellipse. The material of the elliptic mirror was the same as that used in Example 1.

Figure 11:
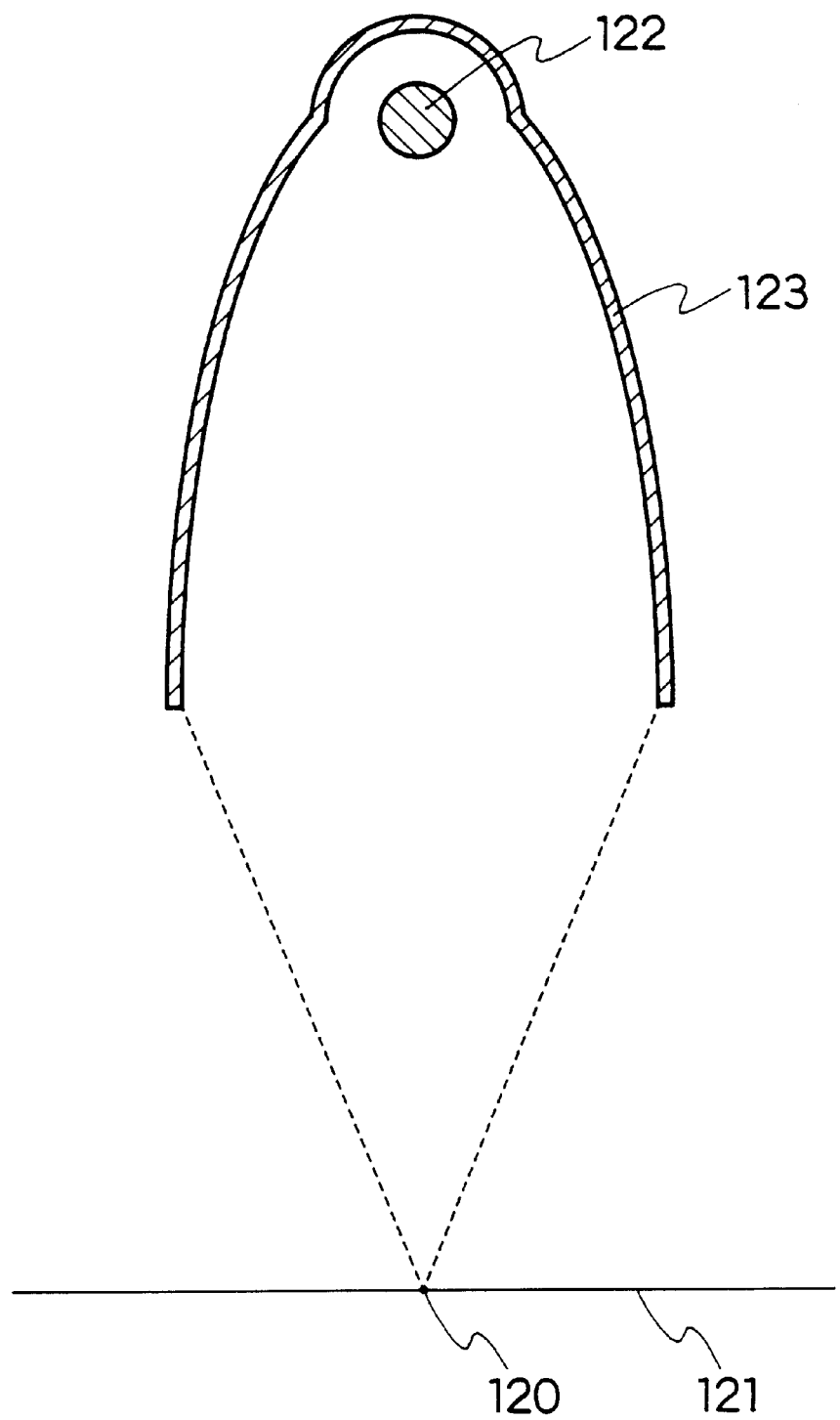
FIG. 11 is an explanatory view of a state of rays from the melting heater being focused on a focus (a focus at the side opposite to the elliptic mirror) on the focal surface.

FIG. 11 is an explanatory view illustrating a state of rays from the melting heater 122 being focused on a focus 120 (a focus at the opposite side of the elliptic mirror) on a focal surface by means of the elliptic mirror 123.

Figure 12:
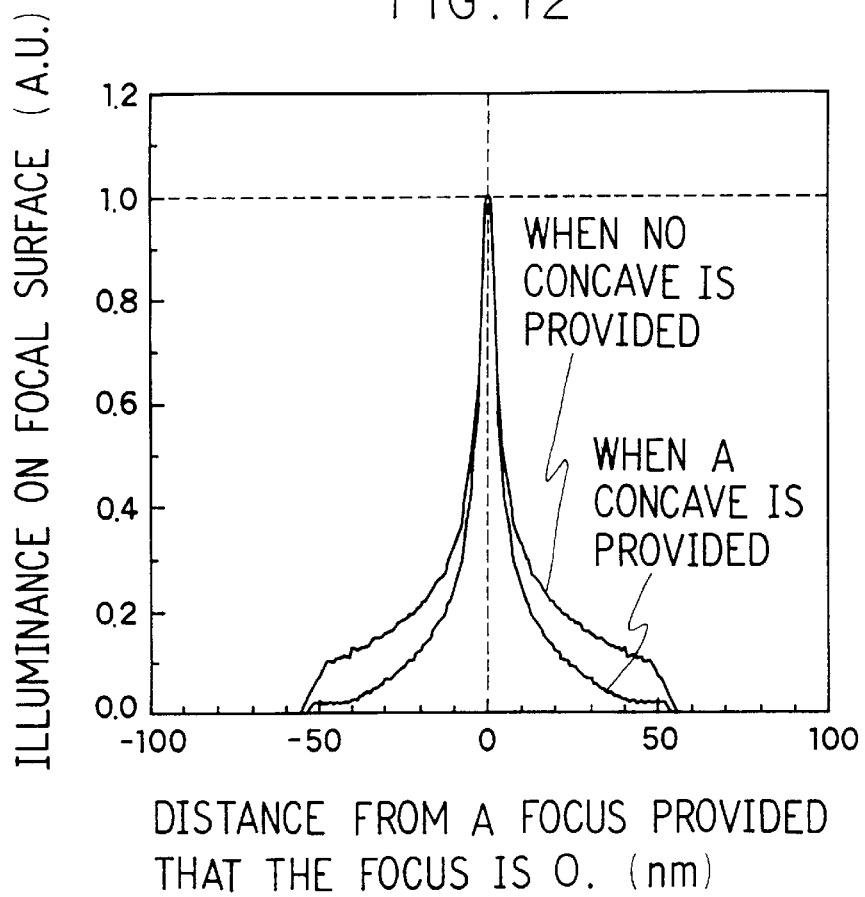
FIG. 12 is a graph showing a relation between a distance (abscissa) from the focus on the focal surface and an illuminance (ordinate) at that distance.
Figure 13:
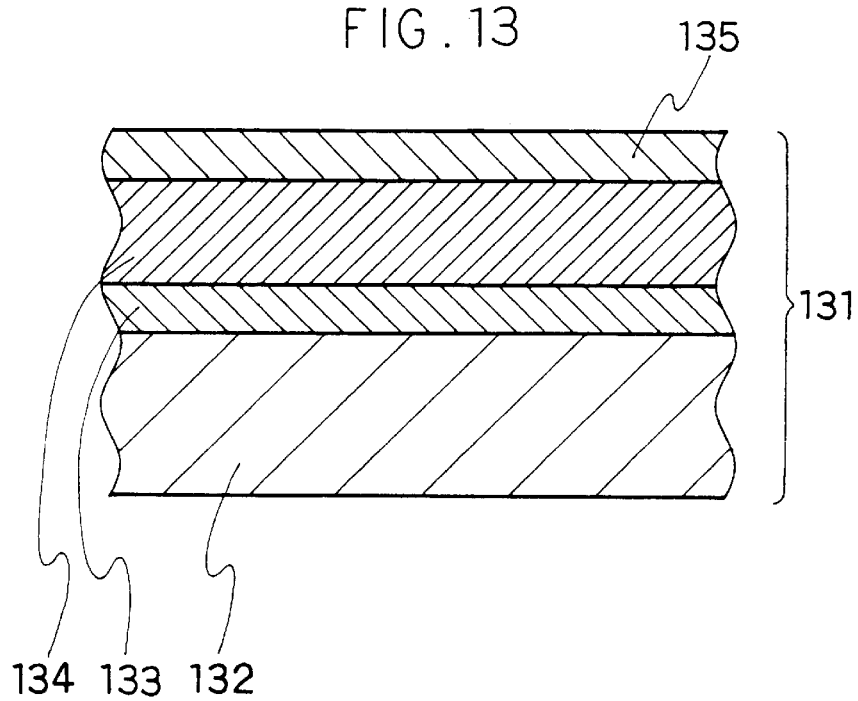
FIG. 13 is a perspective view of a deposited layer having the recrystallized-material-member.
Figure 14:
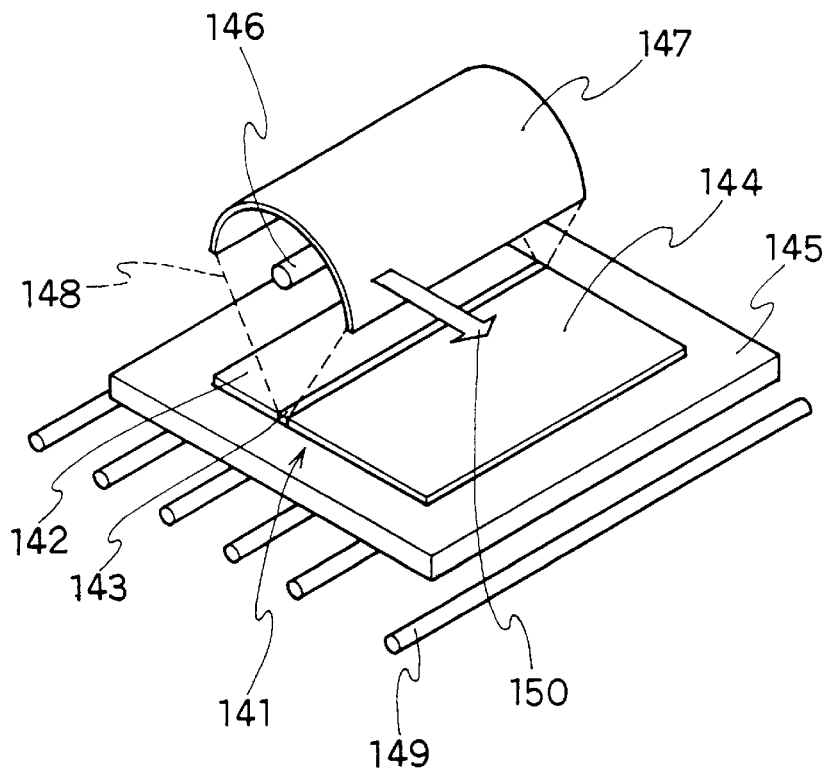
FIG. 14 is an explanatory view of a conventional method of producing a recrystallized-material-member.

FIG. 12 is a graph showing a relation between the distance from the focus (abscissa) on the focal surface and the intensity of illumination at that distance (ordinate). The intensity of illumination on the focal surface is an arbitrary unit obtained by calculating a value of (number of rays at a measuring point)/(total number of rays) and assuming the calculated value at the focus to be 1.0.

Effect of the Invention

The present invention relates to a method of producing a recrystallized-material-member by melting a given zone of a crystalline-material-member and moving continuously the molten zone along the crystalline-material-member to recrystallize a desired region of the crystalline-material-member. According to this method, the recrystallized-material-member having uniform crystal quality can be obtained because dimension of the molten zone of the crystalline-material-member is controlled to be constant and/or the crystal quality of the recrystallized-material-member is controlled to be uniform.

The present invention also relates to a method of producing a recrystallized-material-member by melting a given zone of a crystalline-material-member and moving continuously the molten zone along the crystalline-material-member to recrystallize the desired region of the crystalline-material-member. According to this method, the recrystallized-material-member having uniform crystal quality can be obtained because temperature of the molten zone of the crystalline-material-member is measured and controlled with a non-contact type pyrometer which is sensitive to infrared rays having a wavelength of not less than 4 $\mu$m so that the temperature of the molten zone becomes constant and/or the crystal quality of the recrystallized-material-member becomes uniform.

Also according to the present invention, by recrystallizing the crystalline-material-member in the chamber, it is possible to control atmosphere gas, prevent impurities and foreign matters from mixing and confine heat therein.

According to the present invention, since the above-mentioned chamber is a quartz chamber, it is possible to easily supply energy to the crystalline-material-member from outside the chamber and measure the dimension and temperature of the molten zone of the crystalline-material-member from outside the chamber.

Also according to the present invention, an effect of time saving can be exhibited in case where the given zone of the crystalline-material-member is melted by means of a single or plural melting heaters.

Also according to the present invention, with heating, by using a base heater, the whole crystalline-material-member to a temperature of not more than the melting point of the crystalline-material-member, by melting the given zone of the crystalline-material-member, it is possible to reduce a temperature difference in the whole crystalline-material-member when heated and to decrease thermal stress applied to the crystalline-material-member.

Also according to the present invention, by using quartz pins as a susceptor and heating the whole crystalline-material-member to a temperature of not more than its melting point with a base heater, temperature raising and lowering time of the crystalline-material-member can be shortened.

Also according to the present invention, by supporting the crystalline-material-member with quartz pins or a quartz ring with quartz pins, it is possible to prevent heat insulation and contamination due to impurities.

Also according to the present invention, since the base heater comprises two sets of plural pillar-form heating sources being disposed substantially in plane parallel with each other, wherein one set of plural pillar-form heating sources are disposed substantially at a right angle to another set of plural pillar-form heating sources, it is possible to carry out base heating more effectively with that base heater.

Also according to the present invention, since the crystalline-material-member is a thin film semiconductor, it is possible to easily obtain a highly accurate thin film semiconductor which can be suitably used for semiconductor devices such as LSI devices and solar cells.

Also according to the present invention, since the thin film semiconductor is provided on an insulating substrate or a semiconductor substrate, the crystalline-material-member can be subjected to recrystallization, being directly supported, and thus the thin film semiconductor is difficult to be damaged during the recrystallization and a highly accurate thin film semiconductor can be obtained.

Also according to the present invention, since the above-mentioned thin film semiconductor is sandwiched between the insulators, agglomeration of the crystalline-material-member and mixing of impurities can be prevented.

Also according to the present invention, since the material of the semiconductor substrate is the same as that of the thin film semiconductor, a coefficient of thermal expansion of the insulating substrate or the semiconductor substrate converges on that of the thin film semiconductor which is the crystalline-material-member, and thus thermal stress applied to the thin film semiconductor can be decreased.

Also according to the present invention, since each insulator mentioned above comprises a silicon oxide film, silicon nitride film or a combination thereof and has excellent heat resistance, heat insulating property and permeability of energy, it is possible to conduct recrystallization under suitable conditions.

Also according to the present invention, since the thin film semiconductor is a silicon semiconductor and the coefficient of thermal expansion of the insulating substrate or the semiconductor substrate converges on that of the thin film semiconductor which is a crystalline-material-member, it is possible to decrease thermal stress applied to the thin film semiconductor.

Also according to the present invention, since a shape of the molten zone on a surface of the crystalline-material-member can be made band-like or circular, the desired region of the crystalline-material-member can be recrystallized by simply moving the molten zone in parallel.

Also according to the present invention, in case where a shape of the molten zone on a surface of the crystalline-material-member is band-like, its width is measured, or in case of a shape of the molten zone on a surface of the crystalline-material-member being circular, its diameter is measured, and based on the measured value, the dimension of the molten zone of the crystalline-material-member is controlled to become constant and/or crystal quality of the recrystallized-material-member is controlled to become uniform, and thus recrystallized-material-member having uniform crystal quality can be obtained.

Also according to the present invention, in case where a shape of the molten zone on a surface of the crystalline-material-member is band-like, a width of the band-like molten zone is measured through optical monitoring and in case of a shape of the molten zone on a surface of the crystalline-material-member being circular, a diameter of the circular molten zone is measured through optical monitoring, and based on the measured value, the dimension of the molten zone of the crystalline-material-member is controlled to become constant and/or crystal quality of the recrystallized-material-member is controlled to become uniform, and thus the recrystallized-material-member having uniform crystal quality can be obtained.

According to the present invention, the recrystallized-material-member having uniform crystal quality can be obtained by optically monitoring and measuring, with one or more CCD cameras, a width of the molten zone on the surface of the crystalline-material-member in case of a shape of the molten zone being band-like or a diameter of the molten zone on the surface of the crystalline-material-member in case of the shape of the molten zone being circular, and then based on the measured value, by controlling the dimension of the molten zone of the crystalline-material-member to become constant and/or crystal quality of the recrystallized-material-member to become uniform.

Also according to the present invention, the recrystallized-material-member having uniform crystal quality can be obtained by measuring a width of the molten zone on the surface of the crystalline-material-member in case of the shape of the molten zone being band-like or a diameter of the molten zone on the surface of the crystalline-material-member in case of the shape of the molten zone being circular, based on a difference in optical reflectance between the molten zone and the unmolten zone of the crystalline-material-member, and based on the measured value, by controlling the dimension of the molten zone of the crystalline-material-member to become constant and/or crystal quality of the recrystallized-material-member to become uniform.

Also according to the present invention, the recrystallized-material-member having uniform crystal quality can be obtained by regulating an output of the melting heater or base heater to control the dimension of the molten zone of the crystalline-material-member to become constant or the temperature of the molten zone to become constant and/or crystal quality of the recrystallized-material-member to become uniform.

Also according to the present invention, the recrystallized-material-member having uniform crystal quality can be obtained by regulating a distance between the melting heater and the thin film crystalline-material-member to control the dimension of the molten zone of the crystalline-material-member to become constant and/or the temperature of the molten zone of the crystalline-material-member to become constant or crystal quality of the recrystallized-material-member to become uniform.

Also according to the present invention, the recrystallized-material-member having uniform crystal quality can be obtained by regulating a scanning speed of the melting heater to control the dimension of the molten zone of the crystalline-material-member to become constant or the temperature of the molten zone to become constant and/or crystal quality of the recrystallized-material-member to become uniform.

Also according to the present invention, the recrystallized-material-member having uniform crystal quality can be obtained by regulating, through PID controlling system, an output of the melting heater or base heater, a distance between the melting heater and the crystalline-material-member or a scanning speed of the melting heater to control the dimension of the molten zone of the crystalline-material-member to become constant or the temperature of the molten zone to become constant and/or crystal quality of the recrystallized-material-member to become uniform.

Also according to the present invention, the recrystallized-material-member having more uniform crystal quality can be obtained by defining a set range of 1 to 10 mm for a width of a band-like molten zone when a shape of the molten zone on a surface of the crystalline-material-member is band-like or a set range of 20 to 100 $\mu$m for a diameter of a circular molten zone when a shape of the molten zone on a surface of the crystalline-material-member is circular and by adjusting a measured width or diameter to be within a range of 80 to 120% of the set range.

Also according to the present invention, a recrystallized-material-member having uniform crystal quality can be obtained by focusing energy generated by the melting heater upon the surface of the crystalline-material-member through the elliptic mirror and melting the given zone of the crystalline-material-member.

Also according to the present invention, by using a halogen lamp for the melting heater, a recrystallized-material-member having uniform crystal quality can be easily obtained.

Also according to the present invention, the section of the elliptic mirror is an ellipse having a concave with a specific curvature, and in case where the concave is produced by extrapolating a circle with the curvature, since the center of the circle coincides with one of the focuses of the ellipse and the melting heater does not give interference to the elliptic mirror, energy can be focused suitably onto the desired region of the crystalline-material-member.

Also according to the present invention, when the melting heater is in the pillar form, a recrystallized-material-member having uniform crystal quality can be easily obtained through easy scanning of the melting heater.

Also according to the present invention, when the melting heater is in the form of circular column, energy can be focused onto the desired region of the crystalline-material-member, and therefore, through easy scanning of the melting heater, a recrystallized-material-member having uniform crystal quality can be easily obtained.

Also according to the present invention, the section of the elliptic mirror is an ellipse having a concave with a specific curvature, and in case where the concave is produced by extrapolating a circle with the curvature, the center of the circle coincides with one of the focuses of the ellipse, and in case where the length of the minor axis of the ellipse, the length of the major axis of the ellipse and the radius of the circle are assumed to be "A", "B" and "$R_1$", respectively, the radius $R_1$ is represented by the equation: $R_1 = A^2/B$, thus enabling energy to be focused suitably onto the desired region of the crystalline-material-member.

Also according to the present invention, the melting heater is in the form of circular column, the section of the elliptic mirror is an ellipse having a concave with a specific curvature, and in case where the concave is produced by extrapolating a circle with the curvature, the center of the circle coincides with one of the focuses of the ellipse, and in case where the length of the minor axis of the ellipse, the length of the major axis of the ellipse and the radius of the bottom surface of the melting heater are assumed to be "A", "B" and "$R_2$", respectively, the length B is represented by the equation: $[(A^2/R_2)+R_2]/2 \leq B \leq A^2/R_2$, thus enabling energy to be focused suitably onto the desired region of the crystalline-material-member.

Also according to the present invention, the melting heater is in a pillar-form and made of carbon, tungusten or tantalum. The melting heater is brought near the surface of the crystalline-material-member to melt the given zone thereof, and thus a recrystallized-material-member having uniform crystal quality can be obtained.

Also according to the present invention, a recrystallized-material-member having uniform crystal quality can be obtained easily at a low melting temperature by using an energy generating device as the melting heater and irradiating energy beams onto the surface of the crystalline-material-member to melt the given zone thereof.

Also according to the present invention, a recrystallized-material-member having uniform crystal quality can be obtained more easily at a low melting temperature by using laser beams or electron beams as the above-mentioned energy beam.

Also according to the present invention, a recrystallized-material-member having uniform crystal quality can be obtained by using an apparatus which is used to melt a given zone of the crystalline-material-member, make the molten zone move continuously along the crystalline-material-member and recrystallize a desired region of the crystalline-material-member, and the apparatus comprises the melting heater for supplying energy to the crystalline-material-member to melt the given zone thereof and means for controlling the dimension of the molten zone to become constant and/or crystal quality of the recrystallized-material-member to become uniform.

Also according to the present invention, a recrystallized-material-member having uniform crystal quality can be obtained by using the above-mentioned apparatus, wherein the control means comprises means for measuring dimension of the molten zone of the crystalline-material-member and means for regulating an amount of energy to be supplied to the crystalline-material-member from the melting heater so that the above-mentioned measured value can converge on the preset value.

Also according to the present invention, a recrystallized-material-member having uniform crystal quality can be obtained by using the above-mentioned apparatus, wherein the control means comprises means for measuring a temperature of the molten zone of the crystalline-material-member and means for regulating an amount of energy to be supplied to the crystalline-material-member from the melting heater so that the above-mentioned measured value can converge on the preset value.

According to the heating method of the present invention, which employs the elliptic mirror and the heating source, the section of the elliptic mirror is an ellipse having a concave with a specific curvature, and in case where the concave is produced by extrapolating a circle with the curvature, the center of the circle coincides with one of the focuses of the ellipse and the melting heater does not give interference to the elliptic mirror, and thus enabling energy to be focused suitably onto the desired region of the crystalline-material-member.

According to the heating method of the present invention, the section of the above-mentioned elliptic mirror is an ellipse having a concave with a specific curvature, and in case where the concave is produced by extrapolating a circle with the curvature, the center of the circle coincides with one of the focuses of the ellipse and in case where the length of the minor axis of the ellipse, the length of the major axis of the ellipse and the radius of the circle are assumed to be "A", "B" and "$R_1$", respectively, the radius $R_1$ is represented by the equation: $R_1=A^2/B$, thus enabling energy to be focused suitably onto the desired region of the crystalline-material-member.

Also according to the heating method of the present invention, the above-mentioned heating source is in the form of circular column, the section of the elliptic mirror is an ellipse having a concave with a specific curvature, and in case where the concave is produced by extrapolating a circle with the curvature, the center of the circle coincides with one of the focuses of the ellipse, and in case where the length of the minor axis of the ellipse, the length of the major axis of the ellipse and the radius of the bottom surface of the heating source are assumed to be "A", "B" and "$R_2$", respectively, the length B is represented by the equation: $[(A^2/R_2)+R_2]/2 \leq B \leq A^2/R_2$, thus enabling energy to be focused suitably onto the desired region of the crystalline-material-member.

Also according to the heating method of the present invention, the heating source is in the form of circular column, the section of the elliptic mirror is an ellipse having a concave with a specific curvature, and in case where the concave is produced by extrapolating a circle with the curvature, the center of the circle coincides with one of the focuses of the ellipse, and in case where the length of the minor axis of the ellipse, the length of the major axis of the ellipse, the radius of the circle and the radius of the bottom surface of the heating source are assumed to be "A", "B", "$R_1$" and "$R_2$", respectively, the radius $R_1$ is represented by the equation: $R_1=A^2/B$ and the length B is represented by the equation: $[(A^2/R_2)+R_2]/2 \leq B \leq A^2/R_2$, thus enabling energy to be focused suitably onto the desired region of the crystalline-material-member.

What is claimed is:

1. A method of producing a member of recrystallized material, comprising:

melting a zone of a member of crystalline material to form a molten zone having various dimensions;

moving the molten zone continuously along the member so that previously melted portions of the member solidify to recrystallize a continuous region of the member;

placing a monitoring shape detector and an associated mirror having a reflectivity characteristic which prevents reflection of infrared light in a position relative to the molten zone so that the detector monitors a shape characteristic of the molten zone while being protected from infrared radiation by the mirror during the moving step to obtain control data; and maintaining the shape characteristic constant during the moving step using the control data.

2. The method of claim 1, wherein the monitoring step includes measuring a width of a band shaped molten zone as said shape characteristic.

3. The method of claim 1, wherein the various dimensions include a diameter dimension of a circular molten zone and the monitoring step includes monitoring the diameter as the characteristic maintained in the maintaining step.

4. The method of claim 1, wherein the recrystallized material has uniform crystal quality.

5. The method of claim 1, further including supporting said member with a ring.

6. The method of claim 1, further including supporting said member with pins and a ring.

7. A method of producing a member of recrystallized material in a quartz chamber, comprising:

placing a non-contact pyrometer having a sensitivity to infrared rays of wavelength greater than 4 μm in said quartz chamber;

melting a zone of a member of crystalline material in said quartz chamber using heat from a heat source exterior to said quartz chamber to form a molten zone having various dimensions;

moving the molten zone continuously along the member so that previously melted portions of the member solidify to recrystallize a continuous region of the member;

monitoring a temperature associated with the molten zone with the non-contact pyrometer during the moving step to obtain control data; and maintaining the temperature constant during the moving step using the control data.

8. The method of claim 1 or 7, wherein said melting step includes using a single melting heater or plural melting heaters.

9. The method of claim 1 or 2 wherein said member is provided on a base and the melting step includes reducing thermal stress by heating the base and the member to a temperature not more than a melting point temperature of the member using a base heater.

10. The method of claim 1 or 7, further including supporting said member with pins.

11. The method of claim 1 or 7, further including providing said member as a thin film semiconductor.

12. The method of claim 1 or 7, wherein the member is formed on a base and the maintaining step includes regulating an output of a melting heater or a base heater used in the melting step in forming the molten zone.

13. The method of claim 1 or 7 wherein the member is formed on a base and the maintaining step includes regulating an output of a melting heater or a base heater used in the melting step in forming the molten zone, a distance between the melting heater and the member or a scanning speed of the melting heater.

14. The method of claim 7, wherein the recrystallized material has uniform crystal quality.

15. The method of claim 7, further including supporting said member with a ring.

16. The method of claim 7, further including supporting said member with pins and a ring.

* * * * *

UNITED STATES PATENT AND TRADEMARK OFFICE
CERTIFICATE OF CORRECTION

PATENT NO. : 5,932,003
DATED : August 3, 1999
INVENTOR(S) : Hideo Naomoto et al.

It is certified that error appears in the above-identified patent and that said Letters Patent is hereby corrected as shown below:

Drawings,
Correct Fig. 12 the unit of ordinate "nm" to -- mm --.
The corrected Fig. 12 is attached herewith.

Signed and Sealed this

Twenty-third Day of April, 2002

Attest:

Attesting Officer

JAMES E. ROGAN
Director of the United States Patent and Trademark Office